(12) United States Patent
Thompson et al.

(10) Patent No.: US 10,403,854 B2
(45) Date of Patent: Sep. 3, 2019

(54) OLED DEVICE HAVING ENHANCEMENT LAYER(S)

(71) Applicant: Universal Display Corporation, Ewing, NJ (US)

(72) Inventors: Nicholas J. Thompson, Ewing, NJ (US); Marc A. Baldo, Ewing, NJ (US); Michael S. Weaver, Ewing, NJ (US); Vinod M. Menon, Ewing, NJ (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 0 days.

(21) Appl. No.: 15/935,233

(22) Filed: Mar. 26, 2018

(65) Prior Publication Data

US 2018/0219182 A1 Aug. 2, 2018

Related U.S. Application Data

(63) Continuation of application No. 15/319,050, filed as application No. PCT/US2015/042071 on Jul. 24, 2015, now Pat. No. 9,960,386.
(Continued)

(51) Int. Cl.
*H01L 51/52* (2006.01)
*H01L 51/50* (2006.01)

(52) U.S. Cl.
CPC ...... *H01L 51/5262* (2013.01); *H01L 51/5044* (2013.01); *H01L 51/5203* (2013.01);
(Continued)

(58) Field of Classification Search
None
See application file for complete search history.

(56) References Cited

U.S. PATENT DOCUMENTS 9,263,689 B2 2/2016 O'Carroll et al.
9,865,768 B2 * 1/2018 Liu ..................... H01L 51/5209
(Continued)

FOREIGN PATENT DOCUMENTS

KR 10-2012-0013770 A 2/2012
WO 2010112799 A1 10/2010

OTHER PUBLICATIONS

Kim, Do Weon, (Officer/International Searching Authority-KR) International Search Report dated Nov. 13, 2015 issued in corresponding PCT International Patent Application No. PCT/US2015/042071, pp. 1-2.

*Primary Examiner* — Michelle Mandala
(74) *Attorney, Agent, or Firm* — Duane Morris LLP

(57) ABSTRACT

An OLED is disclosed that includes an enhancement layer having optically active metamaterials, or hyperbolic metamaterials, which transfer radiative energy from the organic emissive material to a non-radiative mode, wherein the enhancement layer is disposed over the organic emissive layer opposite from the first electrode, and is positioned no more than a threshold distance away from the organic emissive layer, wherein the organic emissive material has a total non-radiative decay rate constant and a total radiative decay rate constant due to the presence of the enhancement layer, and the threshold distance is where the total non-radiative decay rate constant is equal to the total radiative decay rate constant; and an outcoupling layer disposed over the enhancement layer, wherein the outcoupling layer scatters radiative energy from the enhancement layer to free space.

20 Claims, 13 Drawing Sheets

Related U.S. Application Data

(60) Provisional application No. 62/092,909, filed on Dec. 17, 2014, provisional application No. 62/078,585, filed on Nov. 12, 2014, provisional application No. 62/028,509, filed on Jul. 24, 2014.

(52) U.S. Cl.
CPC ...... *H01L 51/5234* (2013.01); *H01L 51/5225* (2013.01); *H01L 2251/558* (2013.01)

(56) References Cited

U.S. PATENT DOCUMENTS

| | | |
|---|---|---|
| 2005/0035346 A1 | 2/2005 | Bazan et al. |
| 2009/0121619 A1 | 5/2009 | Rajan et al. |
| 2012/0025172 A1 | 2/2012 | Smigelski, Jr. et al. |
| 2012/0132930 A1* | 5/2012 | Young ................ H01L 31/0481 257/84 |
| 2013/0063023 A1 | 3/2013 | Pan et al. |
| 2014/0230884 A1 | 8/2014 | Shapira et al. |
| 2015/0129851 A1* | 5/2015 | Lee .................... H01L 51/5262 257/40 |

\* cited by examiner

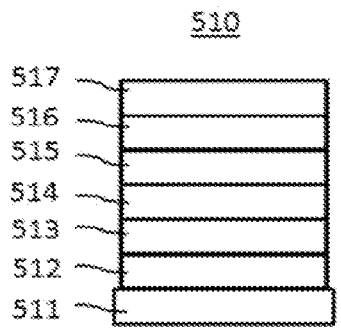
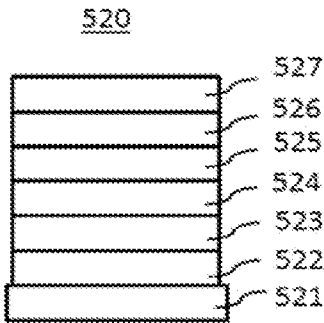
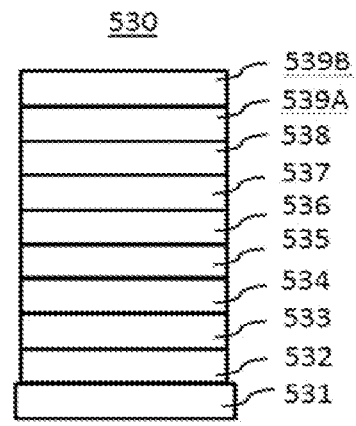
FIG. 9A    FIG. 9B    FIG. 9C
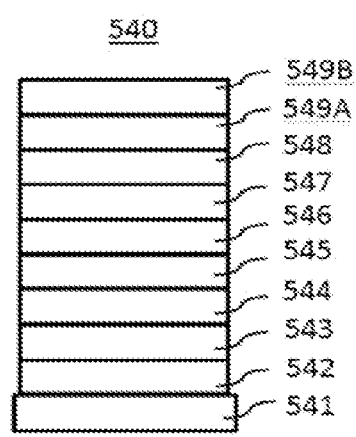
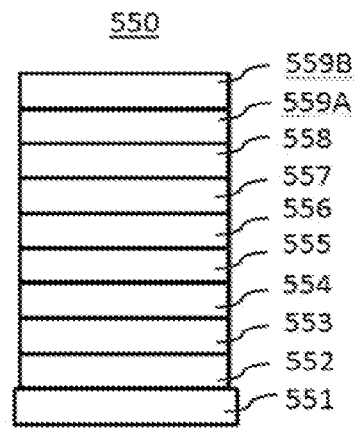
FIG. 9D    FIG. 9E

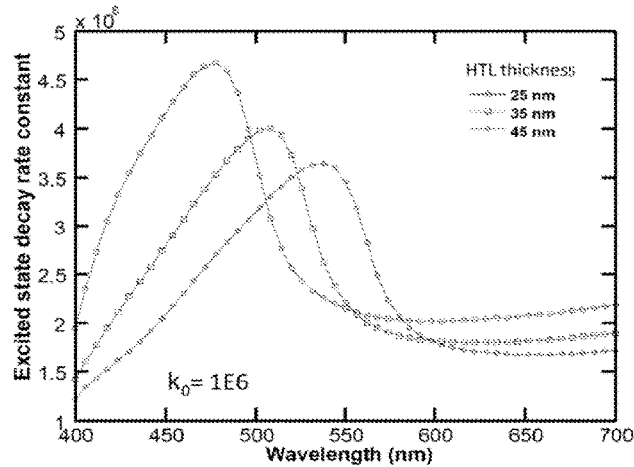
FIG. 14A
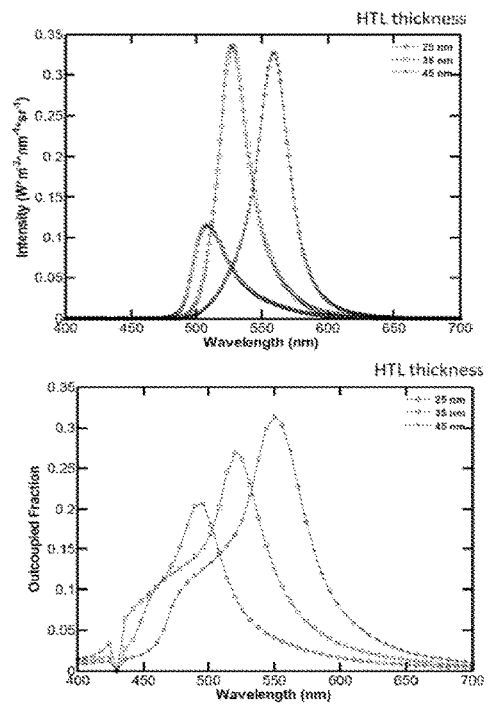
FIG. 14B
FIG. 14C

OLED DEVICE HAVING ENHANCEMENT LAYER(S)

CROSS-REFERENCE TO RELATED APPLICATIONS

This application is a continuation of co-pending U.S. patent application Ser. No. 15/319,050, filed Dec. 15, 2016, which is a U.S. National phase application under 35 U.S.C. § 371 of International Application No. PCT/US2015/042071, filed Jul. 24, 2015, which claims priority to U.S. Provisional Application No. 62/092,909, filed Dec. 17, 2014, U.S. Provisional Application No. 62/078,585, filed Nov. 12, 2014, and U.S. Provisional Application No. 62/028,509, filed Jul. 24, 2014 the entire contents of which are incorporated herein by reference.

FIELD OF THE INVENTION

The present invention relates to a method of enhancing the operation of an organic light emitting device (OLED).

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility and tolerance of disorder, may make them well suited for particular applications such as fabrication on a flexible substrate. Examples of organic opto-electronic devices include OLEDs, organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

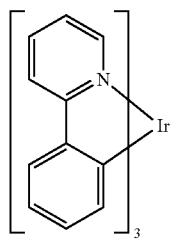

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

As used herein, and as would be generally understood by one skilled in the OLED art, the terms "emitter," "emissive material," "light emitting material," have the equivalent meaning and are used interchangeably. These materials are understood to encompass all organic materials that are phosphorescent material, fluorescent material, thermally activated delayed fluorescent material, chemi-luminescent material, and organic materials that exhibit all other classes of organic emission.

The term "sharp edges" as used herein refers to an edge formed between two surfaces whose cross-section has a radius of curvature between 0 to 10 nm, preferably 0 to 5 nm, and more preferably 0 to 2 nm.

The term "organic emissive layer" of an OLED as used herein refers to the layer in an OLED comprised of a light emitting material or a light emitting material and one or more hosts and/or other materials. Typical organic emissive layer thicknesses are from 0.5 to 100 nm, more preferably 0.5 to 60 nm. When the organic emissive layer is composed of a light emitting material and one or more hosts or other materials, the light emitting material is doped into the emissive layer from 0.01 to 40% by weight, more preferentially, 0.1 to 30% by weight, most preferably 1% to 20% by weight.

The term "wavelength-sized features" as used herein refers to features whose dimensions coincide with one or more of the intrinsic emission wavelengths of the organic emissive material in the organic emissive layer of an OLED. The term "sub-wavelength-sized" as used herein refers to features whose dimensions are smaller than any of the intrinsic emission wavelengths of the organic emissive material in the organic emissive layer of an OLED. Intrinsic emission wavelengths refers to the wavelengths the organic emissive material would emit if it were emitting in free space divided by the refractive index of the organic emissive layer in the OLED.

More details on OLEDs, and the definitions described above, can be found in U.S. Pat. No. 7,279,704, which is incorporated herein by reference in its entirety.

The use of surface plasmon polaritons or localized surface plasmon polaritons for optoelectronic devices recently has been recognized in the OLED industry. However, these systems rely on balancing the trade-off between enhancing the radiative rate of the emitter and preventing non-radiative energy transfer to the surface plasmon mode, also known as quenching. Both the radiative rate enhancement and the non-radiative quenching are a strong function of the distance between the light emitting material and the plasmonic material. To achieve a radiative rate enhancement previous reports utilize a dielectric spacing layer between the light emitting material and the plasmonic material layer in order to prevent quenching. The exact thickness of the dielectric spacer layer depends on many factors including: the composition of the plasmonic material; the thickness of the plasmonic material layer; whether the plasmonic material layer is patterned; the surface roughness of the plasmonic material layer; in the case of the plasmonic material being provided in the form of nanoparticles, the size and shape of the nanoparticles; the dielectric constant of the dielectric spacer layer in contact with the plasmonic material layer; and the wavelength of the emission for the light emitting material.

SUMMARY OF THE INVENTION

According to an embodiment, a method for improving the operation of an OLED is disclosed where the OLED comprises an organic emissive layer comprising an organic emissive material. The method comprises maximizing non-radiative transfer of excited state energy from the organic emissive material to surface plasmon polariton in an enhancement layer by providing the enhancement layer, comprising a plasmonic material exhibiting surface plasmon resonance that non-radiatively couples to the organic emissive material, no more than a threshold distance away from the organic emissive layer, wherein the organic emissive material has a total non-radiative decay rate constant and a total radiative decay rate constant due to the presence of the enhancement layer and the threshold distance is where the total non-radiative decay rate constant is equal to the total radiative decay rate constant; and emitting light into free space from the enhancement layer by scattering the energy from the surface plasmon polariton through an outcoupling layer that is provided proximate to the enhancement layer but opposite from the organic emissive layer. In another embodiment, an intervening layer is provided between the enhancement layer and the outcoupling layer.

According to another embodiment, an enhanced OLED is disclosed. The OLED comprises: a substrate; a first electrode; an organic emissive layer comprising an organic emissive material disposed over the electrode; an enhancement layer, comprising a plasmonic material exhibiting surface plasmon resonance that non-radiatively couples to the organic emissive material and transfers excited state energy from the emissive material to non-radiative mode of surface plasmon polariton, disposed over the organic emissive layer opposite from the first electrode, wherein the enhancement layer is provided no more than a threshold distance away from the organic emissive layer, wherein the organic emissive material has a total non-radiative decay rate constant and a total radiative decay rate constant due to the presence of the enhancement layer and the threshold distance is where the total non-radiative decay rate constant is equal to the total radiative decay rate constant; and an outcoupling layer disposed over the enhancement layer, wherein the outcoupling layer scatters the energy from the surface plasmon polaritons as photons to free space. In other embodiments, an intervening layer is disposed between the enhancement layer and the outcoupling layer, wherein the intervening layer has a thickness between 1-10 nm and a refractive index from 0.1 to 4.0.

According to another embodiment, an enhanced OLED comprises: a substrate, wherein the substrate can be transparent; a first outcoupling layer disposed over the substrate; a first enhancement layer disposed on the first outcoupling layer; an organic emissive layer comprising an organic emissive material disposed over the first enhancement layer, wherein the first enhancement layer comprising a first plasmonic material exhibiting surface plasmon resonance that non-radiatively couple to the organic emissive material and transfer excited state energy from the organic emissive material to non-radiative mode of surface plasmon polaritons, wherein the first enhancement layer is provided no more than a threshold distance away from the organic emissive layer; a second enhancement layer disposed over the organic emissive layer, the second enhancement layer comprising a second plasmonic material exhibiting surface plasmon resonance that non-radiatively couple to the organic emissive material and transfer excited state energy from the organic emissive material to non-radiative mode of surface plasmon polaritons, wherein the second enhancement layer is provided no more than the threshold distance away from the organic emissive layer, wherein the organic emissive material has a total non-radiative decay rate constant and a total radiative decay rate constant due to the presence of the first and second enhancement layers and the threshold distance is where the total non-radiative decay rate constant is equal to the total radiative decay rate constant; the second enhancement layer comprising a second plasmonic material exhibiting surface plasmon resonance that non-radiatively couple to the organic emissive material and transfer excited state energy from the emissive material to non-radiative mode of surface plasmon polaritons; and a second outcoupling layer disposed over the second enhancement layer, wherein the first and second outcoupling layers scatter the energy from the surface plasmon polaritons as photons to free space. In other embodiments, the enhanced OLED further comprises a first intervening layer disposed over the first outcoupling layer between the first outcoupling layer and the first enhancement layer; and a second intervening layer disposed over the second enhancement layer between the second enhancement layer and the second outcoupling layer.

The enhancement layer modifies the effective properties of the medium in which the organic fluorophore or phosphorescent molecule resides resulting in any or all of the following: a decreased rate of emission, a modification of emission line-shape, a change in emission intensity with angle, a change in aging rate of emitter, and reduced efficiency roll-off of the OLED device. Placement of the enhancement layer at the cathode side, anode side, or on both sides results in OLED devices which take advantage of any of the above-mentioned effects.

BRIEF DESCRIPTION OF THE DRAWINGS

FIG. 9A-9E show schematic illustrations of examples of OLED devices with enhancement layer(s). The enhancement layer(s) act as contact(s) for the OLED devices. The OLED can be top or bottom emitting.

FIG. 14A shows optical modeling data for emission rate constant versus wavelength for the preferred structure shown in FIG. 7 demonstrating the predicted broadband increase in emission rate constant.

FIG. 14B shows optical modeling data for emission intensity versus wavelength for the green emitter within the structure demonstrating narrow emission due to the Purcell effect.

FIG. 14C shows optical modeling data for outcoupled fraction of emission versus wavelength for various hole transport layer thicknesses.

Other than the plots shown in FIGS. 3, 4A, 4B, 12, 14A-C, and 15 all figures are illustrated schematically and are not intended to show actual dimensions or proportions. In addition to the specific functional layers mentioned herein and illustrated in the various OLED examples shown in the figures, the OLEDs according to the present disclosure may include any of the other functional layers often found in OLEDs.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
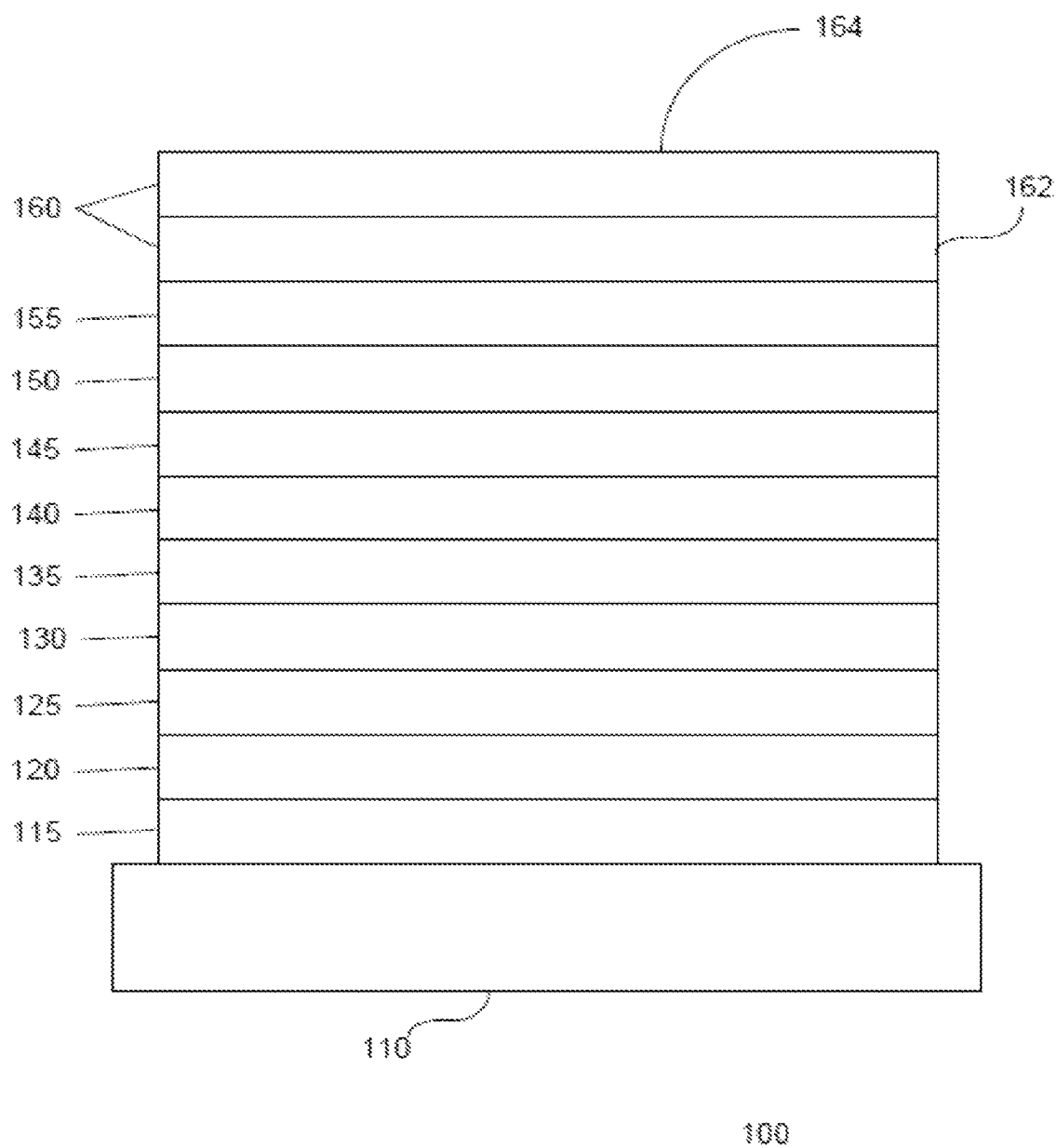
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
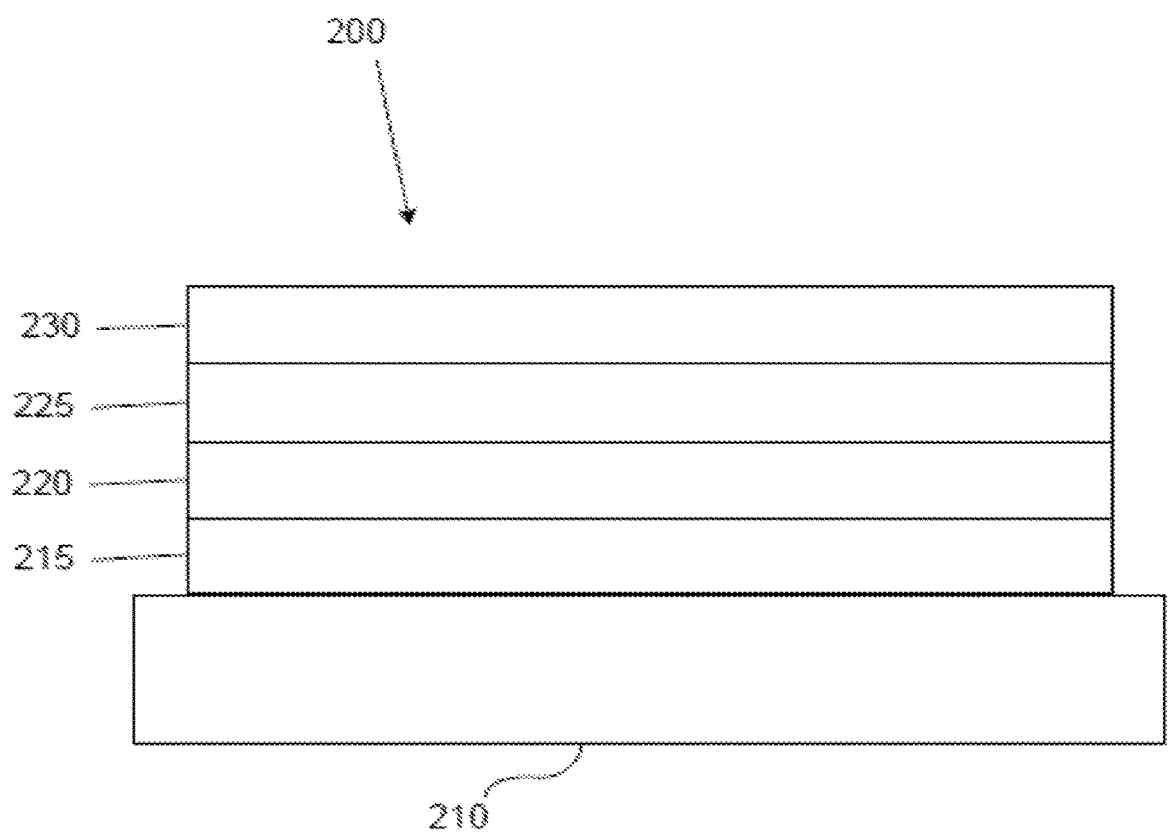
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, microdisplays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

According to an aspect of the present disclosure, unlike the conventional teachings that sought to prevent or inhibit exciton energy transfer to the non-radiative mode of the surface plasmon polaritons ("SPP") in the metal electrodes, as that energy is typically lost, the disclosed method intentionally puts as much energy as possible into the non-radiative mode and then extracts that energy to free space as light using an outcoupling layer.

According to an aspect of the present disclosure, a method for improving the operation of an OLED wherein the OLED comprises an organic emissive layer comprising an organic emissive material is disclosed. The method comprises maximizing non-radiative transfer of excited state energy from the organic emissive material to surface plasmon polaritons in an enhancement layer by positioning the enhancement layer, comprising a plasmonic material exhibiting surface plasmon resonance that non-radiatively couples to the organic emissive material, no more than a threshold distance away from the organic emissive layer, wherein the organic emissive material has a total non-radiative decay rate constant and a total radiative decay rate constant due to the presence of the enhancement layer and the threshold distance is where the total non-radiative decay rate constant is equal to the total radiative decay rate constant; and emitting light into free space from the enhancement layer by scattering the energy from the surface plasmon polaritons through an outcoupling layer provided adjacent to the enhancement layer. It is expected that the closer the emissive material is to the enhancement layer the greater the OLED performance will be. In some embodiments, an intervening layer is provided between the enhancement layer and the outcoupling layer for tuning the wavelength of light that is outcoupled to free space by the outcoupling layer.

After the exciton energy from the emitter is fully captured in the non-radiative mode of the SPP, the energy is emitted as light into free space from the enhancement layer by scattering the energy from the SPP through the outcoupling layer.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In general, a metamaterial is a medium composed of different materials where the medium as a whole acts differently than the sum of its material parts. In particular, we define optically active metamaterials as materials which have both negative permittivity and negative permeability.

Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a film layer of the materials mentioned above. In one preferred embodiment, the enhancement layer is provided as at least one set of gratings formed of wavelength-sized features that are arranged periodically, quasi-periodically, or randomly, or sub-wavelength-sized features that are arranged periodically, quasi-periodically, or randomly. In another preferred embodiment, the wavelength-sized features and the sub-wavelength-sized features have sharp edges.

A grating refers to any regularly spaced collection of essentially identical, parallel, elongated elements. Gratings usually consist of a single set of elongated elements, but can consist of two sets, in which case the second set is usually oriented at a different angle relative to the first set. For example, the second set can be oriented orthogonal to the first set. The grating embodiment for the enhancement layer will be described in further detail below.

Figure 10:
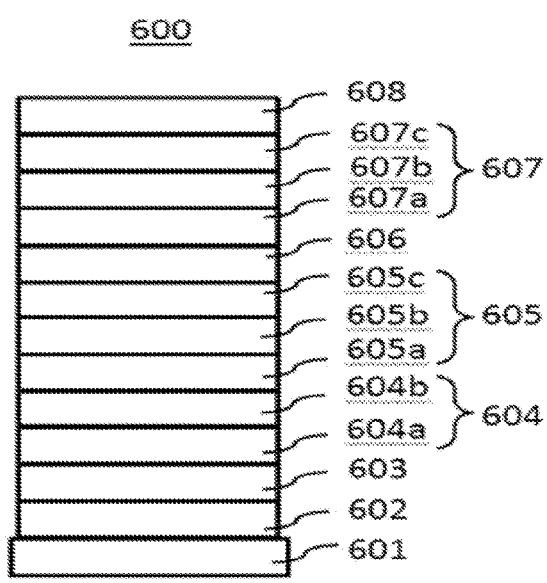
FIG. 10 is a schematic illustration of an example of an enhancement layer OLED device structure according to one embodiment.
Figure 11:
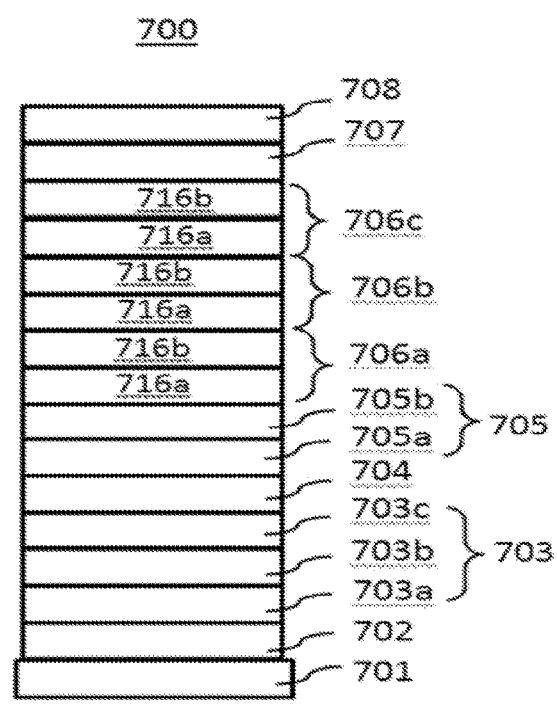
FIG. 11 is a schematic illustration of an example of an enhancement layer OLED device structure according to another embodiment.

The increased emission rate constant of the OLED emitter is strongly dependent on the distance of the emitter from the enhancement layer. Once the emitter is closer than a threshold distance, achieving better performance requires moving the light emitting material closer to the enhancement layer. To achieve a better OLED performance, the preferred distance from the enhancement layer to the organic emissive layer containing the emissive material ("EML") is not greater than 100 nm, more preferably not greater than 60 nm, and most preferably not greater than 25 nm. According to another aspect of the present disclosure, in some cases, for manufacturability reasons it may be desirable to have the distance between the enhancement layer and the EML to be 5-100 nm, more preferably 5-60 nm, and most preferably 5-25 nm. Achieving this desired distance between the EML and the enhancement layer may require providing one or more of the various functional OLED layers between the EML and the enhancement layer so that the EML and the enhancement layer are not in direct contact. Such functional OLED layers are well known in the art. For example, one may include a hole injection layer between the enhancement layer and the emissive material layer to lower the voltage of operation of the OLED. FIGS. 10 and 11 show OLED device architectures showing the various functional OLED layers that may be optionally provided between the EML and the enhancement layer. The minimum threshold distance in this embodiment is desired to be 5 nm because inventors have found that that is about the minimum thickness required for the various materials to form a working functional OLED layer.

Understanding the advantages of using the non-radiative mode of SPP and controlling the distance between the EML and the enhancement layer to be not greater than the threshold distance begins with the decay rate constants of the light emitting material. For any light emitter the Quantum Yield (QY) of photons can be expressed as the ratio of the radiative and non-radiative decay rate constants and is explicitly defined as the number of photons emitted per excited state:

$$QY = \frac{k_{rad}^{total}}{k_{rad}^{total} + k_{non-rad}^{total}} \quad (1)$$

where $k_{rad}^{total}$ is the sum of all the radiative processes and $k_{non-rad}^{total}$ is the sum of all the non-radiative processes. For an isolated emitter in free space, we can define the molecular radiative and non-radiative decay rate constants, $k^0_{rad}$ and $k^0_{non-rad}$. For the isolated molecule, the Quantum Yield (QY°) is:

$$QY^0 = \frac{k_{rad}^0}{k_{rad}^0 + k_{non-rad}^0} \quad (2)$$

However, in an optoelectronic device, such as an OLED, there are a number of other processes which affect the total radiative and non-radiative decay rate constants. Some of these are energy transfer to the radiative and non-radiative decay modes of the surface plasmon in a plasmonic material such as a metal. These modes become important when the light emitting material is in the vicinity of the plasmonic material. This leads to increased values for both the total radiative decay rate constant and total non-radiative decay rate constant in the presence of a plasmonic material. In the quantum yield, these additional processes can be specifically accounted for:

$$QY = \frac{k_{rad}^{total}}{k_{rad}^{total} + k_{non-rad}^{total}} = \frac{k_{rad}^0 + k_{rad}^{plasmon}}{k_{rad}^0 + k_{rad}^{plasmon} + k_{non-rad}^0 + k_{non-rad}^{plasmon}} \quad (3)$$

where $k_{rad}^{plasmon}$ and $k_{non-rad}^{plasmon}$ are the radiative and non-radiative decay rate constants, respectively, for the light emitter when interacting with the SPP.

Figure 3:
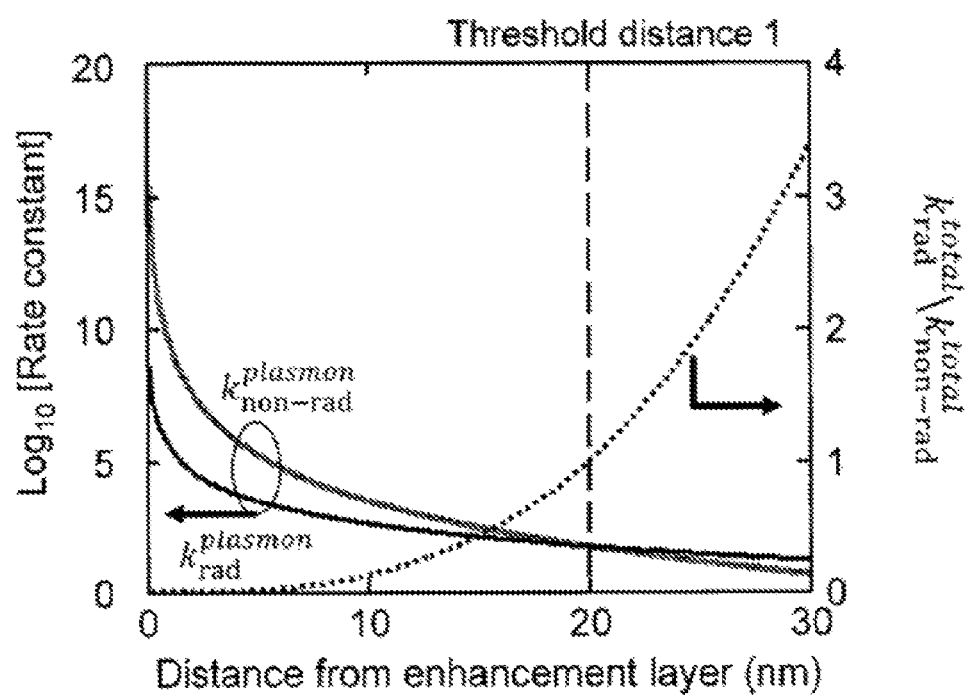
FIG. 3 shows a qualitative plot of the radiative decay rate constant due to the surface plasmon polariton (SPP) mode and the non-radiative decay rate constant due to the SPP mode as a function of distance of the light emitting material from the metallic film. Also plotted is the ratio of the total radiative to non-radiative rate constant for the system as a function of distance of the light emitting material from the metallic film that is dominated by the rate constants due to the SPP mode.

A qualitative plot of $k_{rad}^{plasmon}$ and $k_{non-rad}^{plasmon}$ as a function of the light emitter's distance from an enhancement layer such as a metallic film is shown in FIG. 3. For distances close to the enhancement layer, $k_{rad}^{total}$ will be dominated by the $k_{rad}^{plasmon}$ term and $k_{non-rad}^{total}$ will be dominated by $k_{non-rad}^{plasmon}$. Thus, FIG. 3 also describes the total radiative and non-radiative decay rates. This is shown on the right axis of FIG. 3 which is the ratio of the total radiative decay rate constant, $k_{rad}^{total}$, to the total non-radiative decay rate constant, $k_{non-rad}^{total}$. As is shown on the left axis of FIG. 3, the two plasmon based decay rate constants have different functional dependencies on the distance of the emitter from the metallic layer (in this case $1/r^6$ for the non-radiative and $1/r^3$ for the radiative rate). The different dependencies on distance from the enhancement layer results in a range of distances over which the radiative decay rate constant is the largest rate constant due to the interactions with the surface plasmon. For distances within this particular range, the photon yield is increased over the photon yield of an isolated molecule without the enhancement layer, increasing the QY. This is illustrated in the plot FIG. 4A in which quantum yield is plotted as a function of light emitting material's distance from the metallic film. Once the non-radiative decay rate constant becomes near in value to the radiative decay rate the QY starts to drop, creating a peak in the QY at some specific distance.

For a given pair of light emitting material and enhancement layer, there is a total non-radiative decay rate constant and a total radiative decay rate constant. As the light emitting material layer becomes closer to the enhancement layer, the non-radiative decay rate constant grows more rapidly than the radiative decay rate constant. At some distance, the total non-radiative decay rate constant of the light emitting material in the presence of the enhancement layer is equal to the total radiative decay rate constant of the light emitting material in the presence of the enhancement layer. This will be referred to herein as the Threshold Distance 1. Threshold Distance 1 is the distance the light emitting layer is from the enhancement layer at which the following statement holds:

$$k_{non-rad}^{plasmon} + k_{non-rad}^0 = k_{rad}^{plasmon} + k_{rad}^0 \quad (4)$$

For distances closer to the enhancement layer than the Threshold Distance 1 the total non-radiative decay rate is larger than the radiative decay rate and the quantum yield is less than 0.5 or 50%. For these distances, there is an even larger speed-up in the rate at which energy leaves the light emitter as the non-radiative decay rate constant exceeds the radiative decay rate constant. The enhancement layer-to-emitter distances less than or equal to the Threshold Distance 1 satisfy the following condition:

$$k_{non-rad}^{plasmon} \geq k_{rad}^{plasmon} + k_{rad}^0 + k_{non-rad}^0 \quad (5)$$

For distances larger than Threshold Distance 1 the total radiative decay rate constant is larger than the total non-radiative decay rate constant, however, the quantum yield of the light emitting material is reduced over the case when the enhancement layer is not present. Thus the light emitter is still quenched, a process which is avoided in typical optoelectronic devices but is essential to the operation of this invention.

The distance of the emitter from the enhancement layer at which quenching starts is defined herein as the Threshold Distance 2. At this distance, the QY of the light emitter in the presence and absences of the enhancement layer is identical. When the light emitter is moved closer to the enhancement layer the QY drops. Threshold Distance 2 is the distance the light emitting layer is from the enhancement layer at which the following statement holds:

$$QY^0 = QY \quad (6),$$

where $QY^0$ is the light emitting materials intrinsic quantum yield and QY is the quantum yield with the enhancement layer. This leads to the following expression when accounting for the radiative and non-radiative decay rate constants due to the plasmonic material of the enhancement layer:

$$\frac{k_{rad}^0}{k_{rad}^0 + k_{non-rad}^0} = \frac{k_{rad}^0 + k_{rad}^{plasmon}}{k_{rad}^0 + k_{non-rad}^0 + k_{rad}^{plasmon} + k_{non-rad}^{plasmon}} \quad (7)$$

Solving the $k_{non-rad}^{plasmon}$ we obtain the following expression for the decay rate constants at Threshold Distance 2:

$$k_{non-rad}^{plasmon} = \frac{k_{non-rad}^0}{k_{rad}^0} \cdot k_{rad}^{plasmon} \quad (8)$$

Conceptually Threshold Distance 2 is more easily understood from the value of the quantum yield being equal to the value of the quantum yield of the light emitting material without the enhancement layer. See FIG. 4A.

Whether the Threshold Distance 1 or Threshold Distance 2 are considered, the physical values of the threshold distances depend on a number of factors including the frequency of the surface plasmon polariton, oscillator strength of the light emitting material, and the dielectric constant of the light emitting material layer. Therefore, by selecting a suitable set of materials for the organic light emitting material and the plasmonic material of the enhancement layer, the threshold distance can be adjusted.

Measurable Parameters for a Non-Radiative Energy Transfer OLED

The non-radiative energy transfer OLED can be distinguished from other plasmonic OLEDs by a measurement of the quantum yield of the light emitting material. One would fabricate a number of OLEDs or devices with the enhancement layer but not electrodes with varying enhancement layer-to-emitter distances and one sample with no enhancement layer at all. For each sample, the quantum yield which is defined as the number of photons emitted per each photon absorbed is measured. Threshold distance 1 is the distance at which the total radiative decay rate constant is equal to the total non-radiative decay rate constant, at this distance the photoluminescent quantum yield will be 50% without the enhancement layer. At threshold distance 2 the quantum yield will be the same as the value without the enhancement layer, see FIG. 4A. An additional measure of whether the SPP coupling is increasing the radiative or the non-radiative rate is to measure the temperature of the OLED. Since non-radiative quenching of the exciton generates heat instead of photons, the OLED will heat up. The heat generated in the OLED will be proportional to the yield of non-radiatively recombined excitons when there is no outcoupling layer:

$$\text{High yield} \propto \frac{k_{non-rad}^{total}}{k_{rad}^{total} + k_{non-rad}^{total}}. \quad (9)$$

As the distance between the light emitter and the metallic film is varied, the total heat conduction of the OLED will remain essentially constant, however, the heat yield will vary greatly.

Figure 4A:
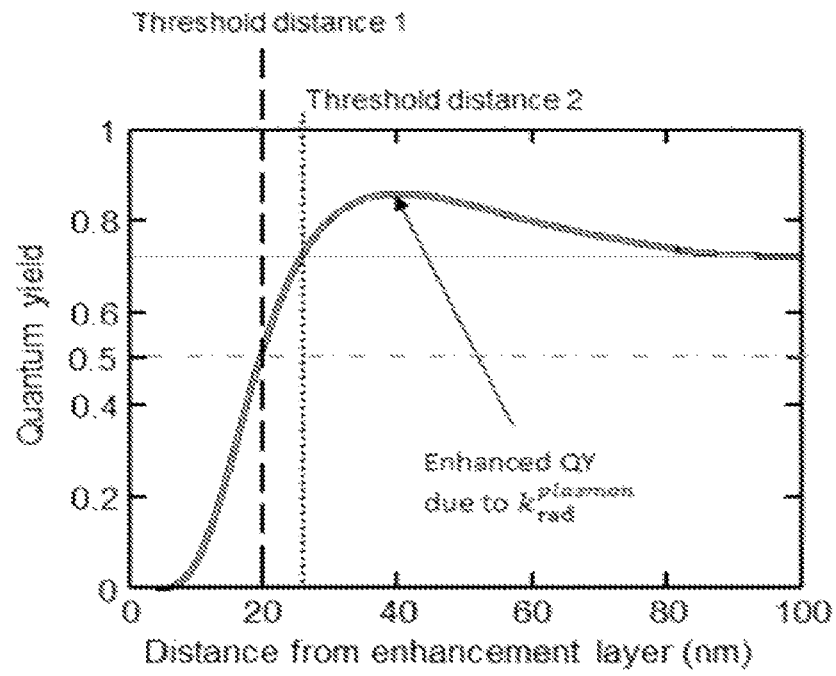
FIG. 4A shows a plot of quantum yield as a function of light emitting material's distance from the metallic enhancement film with two threshold distances identified.
Figure 4B:
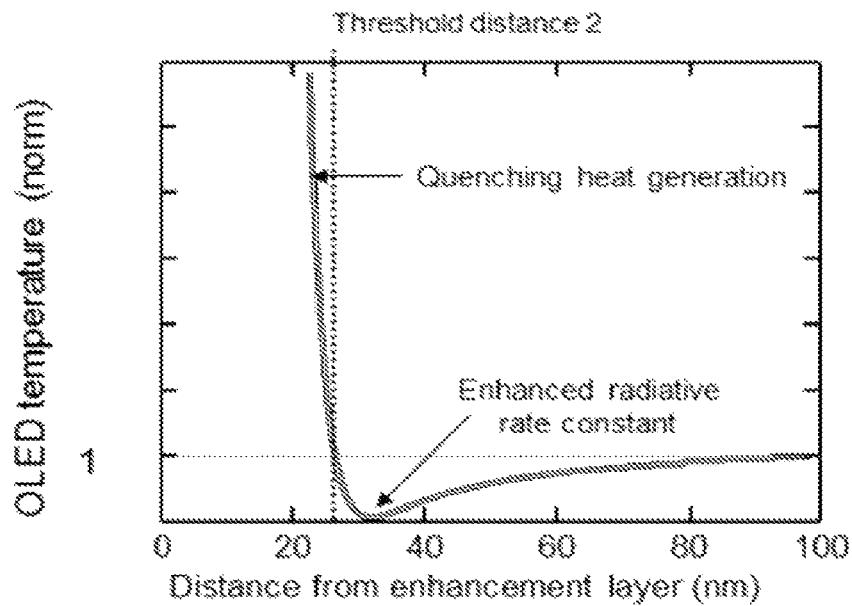
FIG. 4B shows a schematic depiction of the temperature of the OLED as a function of the light emitter's distance from the metallic enhancement film when there is no outcoupling layer for the non-radiative OLED with the threshold distance 2 identified on the plot.

FIG. 4B schematically illustrates the steady state temperature of the OLED as the distance between the light emitter and metallic film layer is varied for a fixed current density of operation. For large distances of the emitting layer from the metallic surface, there is no enhancement of the radiative or non-radiative decay rate constants. The temperature of the OLED depends only on the total current density of operation and the efficiency of the light emitting material. As the emitter is brought closer to the metallic film layer, the radiative decay rate constant increases and the photon yield increases, reducing the heat generated in the OLED and the OLED's steady state temperature. For distances shorter than the threshold distance 2, the excitons on the light emitter are quenched as heat and the OLED's normalized temperature increases.

There may be others but the inventors suggest here two temperature related experiments as examples that can be performed to determine whether the light emitter is positioned no greater than the threshold distance 2 from the enhancement layer such that the non-radiative surface plasmon rate constant is large enough to induce quenching. When the non-radiative decay rate constant is inducing quenching the OLED will heat up more than when the radiative decay rate constant is increasing the quantum yield. In the first experiment, the operating temperature of the OLEDs is measured for a number of OLEDs with varying metallic film-to-emitter distances. For each device operating at a fixed current density, the temperature of the OLED is measured. The OLED will heat up more as the metallic film-to-emitter distance gets shorter than threshold distance 2. In the second experiment, one can build a control OLED in which the metallic film is replaced with a transparent conducting oxide which does not have a strong surface plasmon resonance. One such material is ITO. One can measure and compare the temperature of the control device having the ITO layer against another device having the metallic film. If the temperature of the OLED with the metallic film is higher than the control device with ITO, then, the non-radiative rate is dominant and the distance between the metallic film and the emitter is not greater than the threshold distance 2.

To provide the enhancement layer at a distance not greater than either threshold distance from the organic emissive layer, one of a number of other OLED functional layers can be provided in the space between the enhancement layer and the organic layer. Such OLED functional layers are well known to those skilled in the art. Some examples of such OLED functional layers are illustrated in FIGS. 10 and 11, for example.

Increases in OLED performance occur due to the excited state of the light emitting material energy transferring to the enhancement layer. Enhanced dipole moment coupling of the OLED fluorophore or phosphorescent molecule to the enhancement layer results in (1) an increased emission rate constant for the emitter and (2) increased energy transferred from the molecule to the enhancement layer.

The phenomenon (1) is a result of the unique optical properties of the enhancement layer. The enhancement layer modifies the modes that the emitter experiences increasing the density of states over some spectral range. The increased density of states increases the emitter's radiative and non-radiative decay rate constants. An increased density of states changes the emission spectrum of the emitter if the increase in density of states is not broadband. These effects are referred to as the Purcell effect.

Hyperbolic metamaterials and plasmonic materials are well suited to enhancing the Purcell effect in an OLED as they have broadband photonic states. This is in contrast to DBRs or microcavities where the increase in photon density of states occurs over a narrow spectral window. Hyperbolic metamaterials have been used to increase the emissive rate constant and the emission intensity of quantum dots and laser dyes.

Although hyperbolic metamaterials and plasmonic materials are intrinsically broadband, they can be made narrow, or resonant, through patterning. Patterning can occur either laterally or vertically. Patterning is discussed in more detail below.

Thus, phenomenon (1) is a result of the increase in photonic states that the emitter can sample by introducing the enhancement layer into the OLED. Phenomenon (1) then results in changes to the OLEDs performance. An increased radiative decay rate constant results in a lower exciton density within the emissive layer of the OLED device for a given current density relative to a device without the enhancement layer. This reduces loss mechanisms which rely on two particle collisions such as triplet triplet annihilation and triplet-charge annihilation at high brightness, thus improving OLED performance at high brightness. An increase in the emission rate constant of the emitter will also reduce the average time the emitter spends in the excited state, reducing the total energy stored in the OLED for a given current density of operation. It is expected this will leads to a reduce rate at which the molecule ages into a non-luminescent species, resulting in a longer lifetime for the OLED device.

There are substantial differences between the Purcell effect due to the enhancement layer and an optical microcavity. The first is that the layer thicknesses (physical or optical) are very different.

The enhancement layer effect does not depend on the total thickness of the cavity, only the distance from the emitter to the enhancement layer. In addition, there are no nodes of increased performance as occurs in microcavities which depend on constructive and interference of the emitted photon with the partially reflective mirrors. Instead, the increase in performance is reduced as the light emitting material is moved farther from the enhancement layer. The enhancement layer does not need to be a mirror or mirror-like or even partially reflective. Finally, the thickness of the enhancement layer does not need to be in the order of the wavelength of light to modify the properties of the OLED emitter as is the case for a distributed Bragg reflector.

Phenomenon (2) results in greater total energy dissipation of the emitting molecule to the enhancement layer. This reduces emission lost to the substrate mode and contact layers. Assuming that light is coupled from the enhancement layer to free space, phenomenon (2) results in a greater number of photons emitted per electron. These two results work independently or in tandem to increase OLED performance.

Preferably, the enhancement layer should appear uniform to the wavelength of light, in contrast to typical DBR and microcavity devices previously used in OLEDs. As mentioned above, the enhancement layer can be formed of one or more of metallic film, an optically active metamaterial, and a hyperbolic metamaterial, or any combinations of them, for example.

As mentioned above, in some embodiments, the enhancement layer can be a single layer of metallic film, an optically active metamaterial, and a hyperbolic metamaterial.

Additional increases in performance may be achieved when the enhancement layer is patterned. Preferably, such patterned enhancement layer is at least one set of gratings formed of wavelength-sized features that are arranged periodically, quasi-periodically, or randomly, or sub-wavelength-sized features that are arranged periodically, quasi-periodically, or randomly. In one preferred embodiment, the wavelength-sized features and the sub-wavelength-sized features can have sharp edges.

Patterning of the enhancement layer may increase device performance in multiple ways. First, patterning the enhancement layer with wavelength-sized or sub-wavelength-sized features having sharp edges will produce fringing fields that will couple more efficiently to horizontally oriented molecular dipoles of the emissive species. This will increase the non-radiative decay rate constant of the light emitting material, potentially increasing the durability of the emitter and the total amount of light outcoupled to air.

The second performance enhancement arises when patterning the enhancement layer with periodic wavelength-sized features which creates resonant plasmonic modes. As the periodicity of the patterning increases the bandwidth of the surface plasmon mode can be reduced. Highly periodic structures such as plasmonic materials patterned with a periodic array of holes creates resonant plasmonic modes which may have increased quality factors, narrower spectral width, or lower loss. The reduced bandwidth of the surface plasmon mode allows for selective coupling of the surface plasmon to particular wavelengths of emission while potentially leaving other wavelength emitters un-altered. The selective coupling may be useful for device structures with multiple emitters such as white OLEDs and stack OLEDs. Use of random or quasi-periodic wavelength-sized patterns on the enhancement layer could be used for increasing the bandwidth of response in the context of multiwavelength emitters or broadband emitters.

Finally, patterning of the enhancement layer can facilitate the outcoupling of the non-radiative mode of the surface plasmon to air. This can be achieved by either directly scattering energy from the non-radiative mode of the surface plasmon to air due to the patterning or through increasing the coupling between the non-radiative mode of the surface plasmon and the outcoupling layer. In some embodiments, the patterning of the enhancement layer can be configured to outcouple energy from the non-radiative mode of the surface plasmon to air for all wavelengths in the emission spectrum of the emissive layer. In other embodiments, the patterning of the enhancement layer can be configured to target one wavelength or a subset of wavelengths within the spectrum of the wavelengths emitted from the emissive layer. This is also true for the outcoupling layer disclosed herein.

The patterned enhancement layer can be fabricated in a number of ways. The most precise methods include: photolithography, imprint lithography, or electron beam lithography. Quasiperiodicity may be achieved through depositing on, or templating the enhancement layer with, a self-assembled layer. Quasiperiodic or random patterning may be achieved through roughening the substrate of the OLED device to add texture to the enhancement layer. Any of these methods may be used to pattern a solid metallic film to achieve an optically active metamaterial enhancement layer. The enhancement layer may either be patterned while on the substrate itself with the OLED deposited directly on top of the patterned enhancement layer or the enhancement layer may be patterned on an alternative substrate and then place on the OLED device. Placement methods include stamping, wafer bonding, wet transfer, and ultrasonic bonding.

Figure 13A:
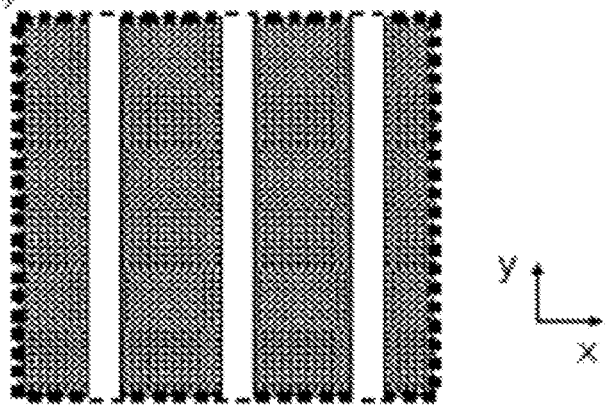
FIG. 13A is a top down view of a 2D patterned enhancement layer.
Figure 13B:
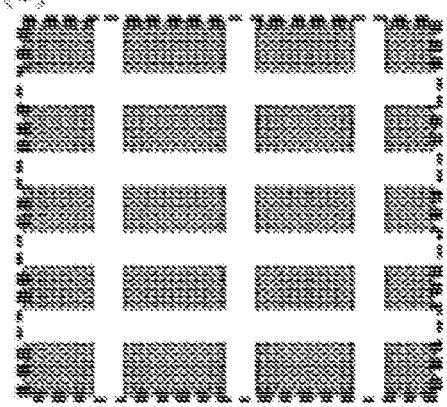
FIG. 13B is a top down view of a 3D patterned enhancement layer.

Patterning the enhancement layer to create a resonant plasmonic effect may be accomplished by two dimensional (2D) or three dimensional (3D) patterning. Periodically patterned enhancement layers may also be referred to as gratings. In a 2D grating, the structural features forming the grating, the wavelength-sized or sub-wavelength-sized features, are arranged in a periodic pattern that is uniform along one direction (i.e., in x-direction or y-direction as labeled in FIG. 13A) in the plane of the enhancement layer. The top-down views of FIGS. 13A and 13B illustrate examples. In a 3D grating, the enhancement layer is formed of two sets of gratings, wherein each set of gratings is oriented in a different direction. In some preferred embodiments, the structural features in the two sets of gratings are oriented orthogonal to each other. The periodic pattern formed by the wavelength-sized or sub-wavelength-sized features in each of the gratings in the two sets of gratings that make up a 3D grating can be uniform or non-uniform along one direction in the plane of the enhancement layer, i.e. in x-direction or y-direction in the plane of the enhancement layer. In FIGS. 13A and 13B, the dark regions and the white regions illustrate the two different materials forming the enhancement layer. As understood by those skilled in the art, either material (i.e., the dark regions or the white regions in the figures) can be considered to be the wavelength-sized or sub-wavelength-sized features forming the grating. In other embodiments, where the enhancement layer comprises a stack of multiple layers (such as unit cells as described in conjunction with FIGS. 5 and 6), one or more of the layers in the stack can be a 2D or a 3D patterned grating layers.

Lateral patterning of the enhancement layer as specified above may also be used to tune the spectral width, frequency, and loss of the enhancement layers plasmonic modes. A narrow plasmonic enhancement allows for color tuning of the emitter. A less lossy enhancement layer increases the efficiency of the OLED device. A resonant plasmonic mode in the enhancement layer may increase the enhancement to the rate constant of emission of the emitter.

The enhancement layer can be formed as at least one set of gratings. In 2D patterned grating embodiments where one layer has one grating pattern, the grating can have a periodic pattern, wherein the wavelength-sized or sub-wavelength-sized features are arranged uniformly along one direction. The wavelength-sized or sub-wavelength-sized features can be arranged with a pitch of 100-2000 nm with a 10-90% duty cycle, and more preferably 20-1000 nm with a 30-70% duty cycle. The pattern may be composed of lines or holes in the enhancement layer. However the pattern does not need to be symmetric. It could be locally patterned over the distance of 1 micrometer and then have no pattering for several micrometers before repeating the pattering again.

In 3D patterned grating embodiments, the enhancement layer is formed of two sets of gratings, wherein in each set of gratings, the wavelength-sized or sub-wavelength-sized features are arranged non-uniformly along one direction with a pitch of 100-2000 nm with a 10-90% duty cycle, wherein each set of gratings is oriented in different direction. The two sets of gratings can be oriented orthogonal to each other. The wavelength-sized or sub-wavelength-sized features can be arranged with a pitch of 100-2000 nm with a 10-90% duty cycle in x-direction and y-direction. Preferably, the wavelength-sized or sub-wavelength-sized features can be arranged with a pitch of 20-1000 nm with a 30-70% duty cycle in both x and y-directions. There is also no requirement on symmetry for 3D patterning.

According to an aspect of the disclosure, whether the enhancement layer is provided as a film layer or at least one set of gratings, the enhancement layer can be formed as vertically stacked repeated unit cells. All of the unit cells in the stack can be the same or each of the unit cells in the stack can have different material composition. Preferably, an enhancement layer can have up to 10 unit cells and more preferably up to 5 unit cells. In an embodiment that has one unit cell, such unit cell can be a single layer of plasmonic material whether it be a solid film layer or a grating layer. It should be noted that this is different from a DBR in the fact that more unit cells in the enhancement layer does not necessarily represent greater performance.

Figure 5:
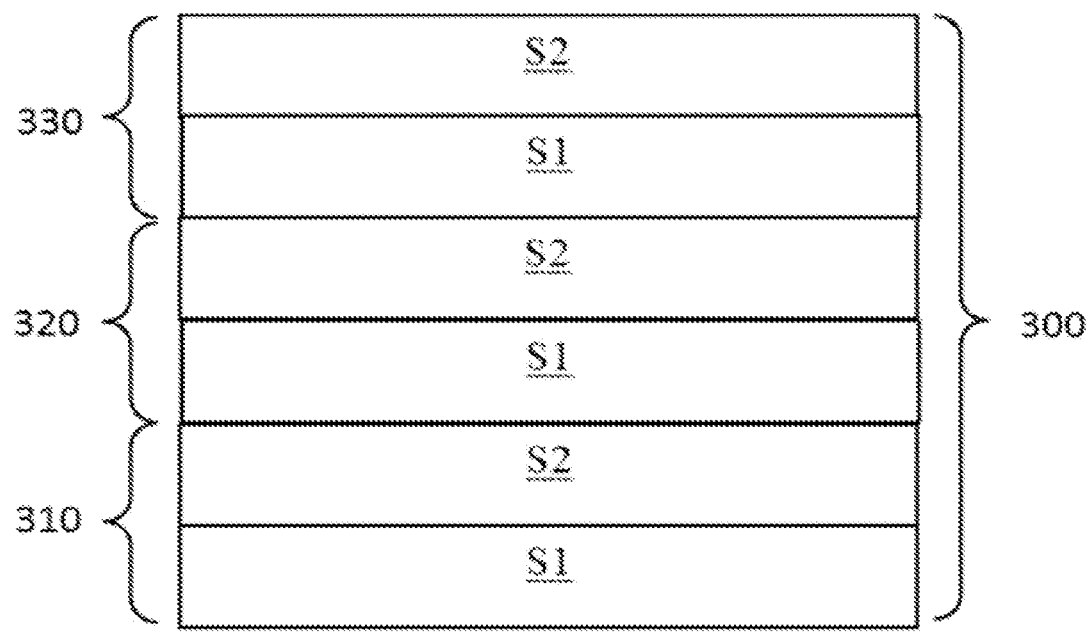
FIG. 5 is a schematic illustration of an example of enhancement layer comprised of three unit cells.

In embodiments having multiple layer unit cells, the unit cells may have subcomponents, as shown in FIG. 5. FIG. 5 features an enhancement layer 300 comprised of three unit cells 310, 320, and 330, where each unit cell has two subcomponent layers, S1 and S2.

Figure 6:
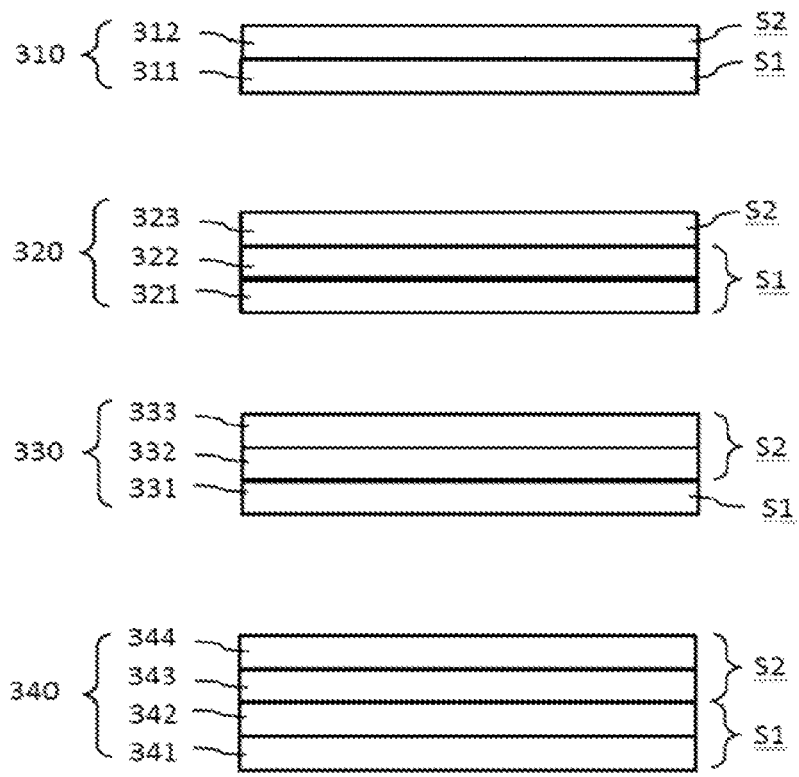
FIG. 6 is a schematic illustration of an example design for the unit cell which comprises the enhancement layer. Each subcomponent layer of the unit cell may be composed of different materials, as shown.

In some embodiments, each subcomponent layers can be further formed of multiple layers of materials. Examples of such architecture are shown in FIG. 6. In the unit cell 310, first subcomponent S1 is a metallic layer 311 and second subcomponent S2 is a dielectric layer 312. In the unit cell 320, first subcomponent S1 comprises a first metallic layer 321 and a second metallic layer 322, and second subcomponent S2 is a dielectric layer 323. In the unit cell 330, first subcomponent S1 is a metallic layer 331 and second subcomponent S2 comprises a first dielectric layer 332 and a second dielectric layer 333. In the unit cell 340, first subcomponent S1 comprises a first metallic layer 341 and a second metallic layer 342. Second subcomponent S2 comprises a first dielectric layer 343 and a second dielectric layer 344. The plasmonic material can be a metal selected from the group consisting of Ag, Au, Al, Pt, and alloys of any combination of these materials. The plasmonic material can also be conducting doped oxides (examples include In—Ga—ZnO and In—Sn oxide), or doped nitrides. Most preferably the plasmonic material is Ag.

In some embodiments, the enhancement layer has an imaginary component of the refractive index greater than 1 over for some part of the wavelength spectrum from 400-750 nm.

The enhancement layer may be deposited by a number of processing techniques including electron beam evaporation, thermal evaporation, atomic layer deposition, sputtering, and various chemical vapor deposition techniques. The dielectric layer can include small organic molecules, polymers, wide bandgap oxides ($SiO_2$, $TiO_2$, $Al_2O_3$, etc.), insulating nitrides, and undoped semiconductors (Si and Ge for example). The real part of the refractive index of these materials can span 1.3 to 4.1. The imaginary component may be less than 1 over the wavelength range of 400 to 750 nm. The dielectric layers may be deposited by thermal evaporation, ink jet printing, organic vapor jet printing, spin coating, doctor blading, the Langmuir-Blodgett technique, pulsed laser deposition, sputtering, and various chemical vapor deposition methods including atomic layer deposition. Optically active metamaterials can also be made by patterned grooves in solid metallic films. The films would be deposited by any of the methods cited above.

Figure 7:
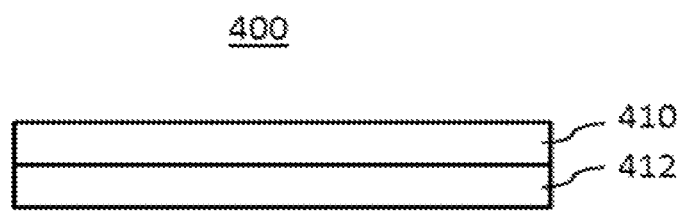
FIG. 7 is a schematic illustration of an example enhancement layer design.

Referring to an example shown in FIG. 7, in some embodiments, the enhancement layer is a stack 400 comprising a film of plasmonic material 410 and a film of an adhesion material 412. The plasmonic material is a metal selected from the group consisting of Ag, Au, Al, Pt, and alloys of any combination of these materials. The adhesion material is selected from the group consisting of Ni, Ti, Cr, Au, Ge, Si, and alloys of any combination of these materials. Preferably the adhesion material is Ni, Ti, or Ge and more preferably Ge. In one preferred embodiment, the plasmonic material is Ag and the adhesion material is Ge.

Preferably, the layer of plasmonic material has a thickness of 0.2 to 50 nm and the layer of adhesion material has a thickness of 0.1 to 10 nm. More preferably, the layer of adhesion material has a thickness of 0.2 to 5 nm. More preferred thicknesses of the plasmonic material depend on the exact OLED structure but typically range from 5 to 30 nm. When using this preferred structure the RMS surface roughness of the enhancement layer measured over a 2 µm by 2 µm area should be between 0 to 5 nm; more preferably between 0 and 2 nm. The resistivity of the Ag layer should fall between 0.1 to 100 ohms per square, more preferably 0.5 to 20 ohms per square. The transparency of the preferred structure between the wavelength range of 400 to 800 nm falls between 40 to 100%; more preferably, between 60 to 95%.

Figure 8A:
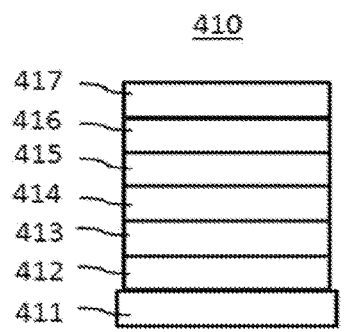
FIGS. 8A-8C show schematic illustrations of examples of OLED devices with enhancement layer(s). The OLED devices feature individual anode and cathode contact layers. The OLED can be top or bottom emitting.
Figure 8B:
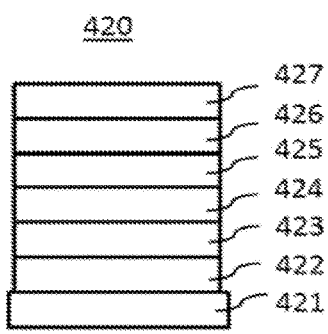
Figure 8C:
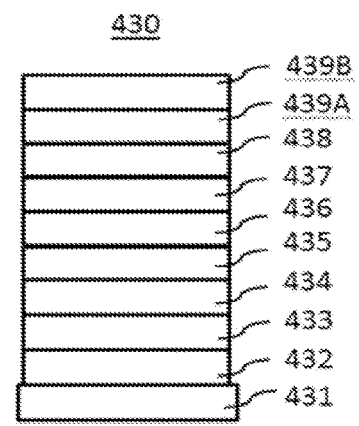

The enhancement layer can be incorporated into an OLED in various ways. FIGS. 8A-8C and FIG. 9 demonstrate examples of top and bottom emitting OLEDs which have the enhancement layer. The OLED's emission can be monochrome, multi-colored, or white. FIGS. 8A-8C show some examples of OLEDs according to the present disclosure in which both anode and cathode contact layers are provided in addition to the enhancement layers. FIG. 8A shows an example of a top-emitting OLED 410 comprising, in the positional order, a substrate 411, a first electrode 412 (an anode in this case), organic EML layer 413, a second electrode 414 (a cathode in this case), an enhancement layer 415, an intervening layer 416, and an outcoupling layer 417. FIG. 8B shows an example of a bottom-emitting OLED 420 comprising, in the positional order, a transparent substrate 421, an outcoupling layer 422, an intervening layer 423, an enhancement layer 424, an anode 425, an organic EML layer 426, and a cathode 427. FIG. 8C shows a two-way emitting OLED 430 comprising, in the positional order, a transparent substrate 431, an outcoupling layer 432, an intervening layer 433, a first enhancement layer 434, an anode 435, an organic EML layer 436, a cathode 437, a second enhancement layer 438, a second intervening layer 439A, and a second outcoupling layer 439B.

As disclosed herein, in some embodiments of the OLEDs according to the present disclosure, the OLEDs can be configured so that the enhancement layers are also the contact layers. FIGS. 9A-9E illustrate such examples. FIG. 9A shows a bottom-emitting OLED 510 comprising, in the positional order, a transparent substrate 511, an outcoupling layer 512, an intervening layer 513, an enhancement layer 514, one or more optional functional layers 515, an organic EML 516, and a cathode 517. In the OLED 510, the enhancement layer 514 is used as the anode contact layer.

FIG. 9B shows a top-emitting OLED 520 comprising, in the positional order, a substrate 521, an anode 522, an organic EML 523, one or more optional functional layers 524, an enhancement layer 525, an intervening layer 526, and an outcoupling layer 527. In the OLED 520, the enhancement layer 525 is used as the cathode contact layer. FIG. 9C shows a two-way emitting OLED 530 comprising, in the positional order, a transparent substrate 531, a first outcoupling layer 532, a first intervening layer 533, a first enhancement layer 534, an anode 535, an organic EML 536, one or more optional functional layers 537, a second enhancement layer 538, a second intervening layer 539A, and a second outcoupling layer 539B. In the OLED 530, the second enhancement layer 538 is used as the cathode contact layer. FIG. 9D shows a two-way emitting OLED 540 comprising, in the positional order, a transparent substrate 541, a first outcoupling layer 542, a first intervening layer 543, a first enhancement layer 544, one or more optional functional layers 545, an organic EML 546, a cathode 547, a second enhancement layer 548, a second intervening layer 549A, and a second outcoupling layer 549B. In the OLED 540, the first enhancement layer 544 is used as the anode contact layer. FIG. 9E shows another two-way emitting OLED 550 comprising, in the positional order, a transparent substrate 551, a first outcoupling layer 552, a first intervening layer 553, a first enhancement layer 554, a first set of one or more optional functional layers 555, an organic EML 556, a second set of one or more optional functional layers 557, a second enhancement layer 558, a second intervening layer 559A, and a second outcoupling layer 559B. In the OLED 540, the first enhancement layer 554 and the second enhancement layer 558 are used as the anode contact layer and the cathode contact layer, respectively.

In the OLED examples of FIGS. 9A-9E, the various sets of one or more optional functional layers 515, 524, 537, 545, 555, 557, and the contact layers 535 and 547 that are positioned between an enhancement layer and an organic EML layer are configured to have the appropriate thickness to meet the requirement that the corresponding enhancement layer is no more than the threshold distance away from the respective organic EML layer.

FIGS. 8A, 8B, and 9A-9E illustrate embodiments of devices that include intervening layers. However, as discussed throughout, embodiments without the intervening layers are also within the scope of the present disclosure.

An OLED's contact materials are often chosen so that the Fermi level injects charges into the device while the metallic layers of the enhancement layer are chosen for their optical properties. However, using hole and electron injection layers can facilitate charge injection allowing the enhancement layer to act as a contact layer for the OLED. Thus, using the enhancement layer as a contact is not a requirement of the layer but an opportunity to reduce the complexity of manufacturing.

If the enhancement layer is not used as a contact, the OLED contact layer is a conductive medium typically composed of either a transparent conducting oxide (TCO) or a metal film. Typical TCO thicknesses range from 50 to 200 nm, with more preferred thicknesses between 80 to 150 nm when the TCO is not between the enhancement layer and the EML. When the TCO is between the enhancement layer and the EML the total thickness must be less than the threshold thickness. Metal contact layers typically vary between 7 to 300 nm in thickness when not between the enhancement layer and the EML.

If the enhancement layer is chosen as a contact, it could be implemented in two different ways: either the entire structure is the contact or a sub-component is. If a partially conductive dielectric material is included as a subcomponent layer (given that it meets the optical requirements) the entire enhancement layer is conductive and acts as the contact. In contrast, the enhancement layer can include a metallic layer subcomponent which could be the contact. This includes using either the first metallic layer within the enhancement layer or the last metallic layer in the enhancement layer depending on the exact OLED architecture (top or bottom emitting). FIGS. 9A-9E highlight various device architectures which demonstrate the placement of the enhancement layer within an OLED device when an enhancement layer is used as at least one of the OLEDs contacts.

The increased emission rate constant of the OLED emitter is strongly dependent on the distance of the emitter from the enhancement layer. To achieve better OLED performance the preferred distance from the enhancement layer to the EML is not greater than the threshold distance and is as small as possible within the limits discussed herein. The typical threshold distance for a phosphorescent molecule is less than 100 nm, and more typically less than 60 nm. Achieving the short distance between the EML to the enhancement layers may require adjusting the OLED architecture by controlling the thickness of a contact layer or other one or more functional layers that may be provided between the organic EML layer and an enhancement layer. FIG. 10 and FIG. 11 show examples of OLED device architectures showing some of such one or more functional layers that may be used to achieve the desired distance between the enhancement layers and the organic EML layer.

FIG. 10 provides an illustration of a bottom-emitting OLED 600. The OLED 600 comprises, in the positional order, a transparent glass substrate 601, an outcoupling layer 602 disposed over the substrate, an intervening layer 603, an enhancement layer 604, a first set of one or more optional functional layers 605, an organic EML layer 606, a second set of one or more optional functional layers 607, and a cathode contact layer 608. According to an aspect of the present disclosure, the enhancement layer 604 in this example is formed of two subcomponent layers: adhesion layer 604a and a plasmonic material film layer 604b. The first set of one or more optional functional layers 605 may be selected from a protective TCO layer 605a, a hole injection layer 605b, a hole transport layer 605c, and electron blocking layer 605d. The second set of one or more functional layers 607 may be selected from a hole blocking layer 607a, an electron transport layer 607b, and an electron injection layer 607c.

FIG. 11 provides an illustration of a top-emitting OLED 700. The OLED 700 comprises, in the positional order, a substrate 701, an anode 702, a first set of one or more optional functional layers 703, an organic EML layer 704, a second set of one or more optional functional layers 705, an enhancement layer 706, an intervening layer 707, and an outcoupling layer 708. The first set of one or more optional functional layers 703 may be selected from a hole injection layer 703a, a hole transport layer 703b, and an electron blocking layer 703c. The second set of one or more optional functional layers 705 may be selected from a hole blocking layer 705a, an electron transport layer 705b, an electron injection layer 705c. The enhancement layer 706 comprises a stack of three unit cells 706a, 706b, and 706c, wherein each of the unit cells consist of a Ag as the plasmonic material film 716a, and a host material film 716b. The detailed discussion of such stacked unit cell structure is provided above in connection with the discussion of FIGS. 5 and 6.

When using the enhancement layer as a contact for the OLED, it may be beneficial to use nontraditional materials or no materials at all as the hole or electron injection layer in order to bring the molecules in the excited state in the EML of the OLED closer to the enhancement layer. In addition to the materials defined earlier, we define a hole injection material is any material with a HOMO lower than or equal to the dopant in the OLED. This sets a preferred range for the HIL HOMO from −8 eV to −4.7 eV. Importantly, the emitter material itself can act as the hole injection layer. Similarly, an electron injection material will be a material with a LUMO level slightly below to above the LUMO level of the OLED dopant. The preferred range for the EIL material's LUMO is from −4 eV to −1.5 eV. Charge injection may also be accomplished by the dopant itself either as a neat layer or highly doped in a host.

When using the enhancement layer, the layers between the enhancement layer and the EML are preferably thinner than the threshold distance to achieve the best result. For example, when using the enhancement layer near or as the anode, the HIL and HTL layers should be quite thin. Improving device yield or manufacturability of the OLED may require increasing the overall thickness of the OLED.

In theory, the OLED can be of arbitrary thickness. However, for thicker OLEDs it is expected that the operational voltage will increase due to resistive losses in transport of charge through the charge transporting layers. Thus, the preferred OLED thickness range for a single stack OLED is from 10 to 500 nm, more preferably from 20 to 300 nm. For OLEDs with multiple EMLs the thicknesses scales with the number of EMLs. For example, a 2 EML device has a preferred OLED thickness range from 20 to 1000 nm, more preferably from 40 to 600 nm.

When using an enhancement layer in an OLED the layers opposite the enhancement layer will have minimal effect on the emitter's properties, especially if excitons are confined within the EML. However, there are second order effects that can be maximized to improve the performance of the enhancement layer OLED.

Figure 12:
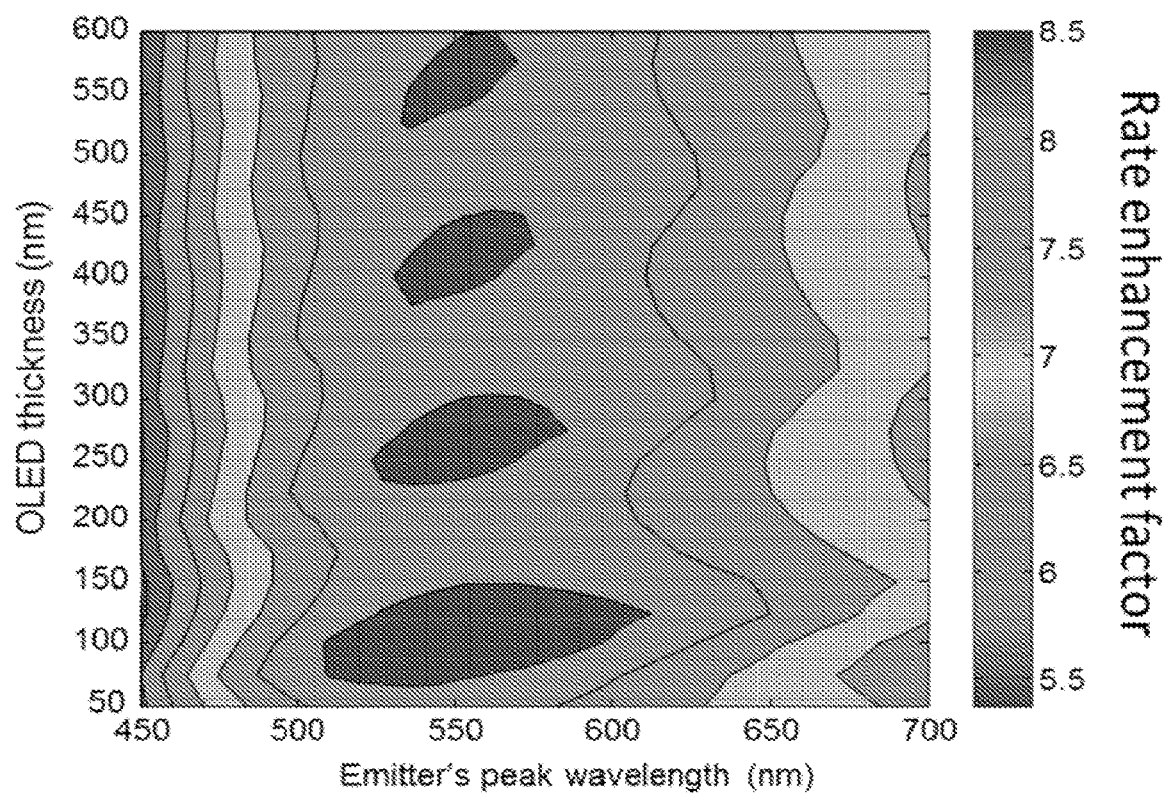
FIG. 12 is a plot showing the enhancement factor of the light emitter's rate constant as a function of emitter's peak wavelength and the total OLED thickness.

Changes occur in the density of states that the enhancement layer creates for the emitting molecule when the total thickness of the OLED is changed. FIG. 12 is a plot of the calculated enhancement of the emitter's emission rate constant in the OLED relative to the emission rate constant in air as a function of the OLEDs total thickness and the emitter's peak emission wavelength. The emission rate constant is the total decay rate constant which is the sum of non-radiative and radiative decay but is dominated by non-radiative decay for these device structures. The enhancement layer-to-emitter distance was kept constant. There are nodes of increased performance (see emitter peak emission of 530 nm) about every 150 nm of OLED thickness. However, the change in the rate constant enhancement is ~10 to 30% higher at a peak than in the trough, changes that are smaller than moving the light emitter farther from the metallic film.

The in-plane momentum of the surface plasmon in the enhancement layer depends on the refractive index of the layers bordering the enhancement layer. Inserting an intervening layer between the enhancement layer and the outcoupling layer can tune the wavelength of light that is outcoupled to free space by an outcoupling layer of fixed periodicity. The index of refraction of the material between the enhancement layer and the outcoupling layer also changes the fraction of energy that flows between the two as it modifies the total mode overlap. The real part of the index of refraction of the intervening layers is between 1.1 to 4.0 and more preferably between 1.3 to 2.4. The intervening layer may be a dielectric material, a semiconductor material, a metal, or any combination thereof and has a thickness between 1-20 nm, more preferably between 1-10 nm.

The benefit of using the enhancement layer to increasing the EQE of an OLED may be best realized by using the enhancement layer in combination with an outcoupling layer to increase the number of photons directed into free-space. The increase in excited state decay rate constant of the light emitter in the EML is due to the excited state energy transferring to the non-radiative modes of the surface plasmon of the enhancement layer. Once the energy is transferred to the surface plasmon, the surface plasmon cannot couple all the energy to free-space. The outcoupling layer will remove the captured energy from the enhancement layer and couple that light to free-space.

Realizing an enhancement layer with a coupling layer could result an in OLED with an EQE greater than 40% and theoretically have an EQE of 100%. An EQE in excess of ~43% exceeds the conventional limit and can be achieved even with a high number of vertically oriented emitters. The closer the light emitting material is to the enhancement layer the smaller the impact of molecular orientation on the performance of the enhancement layer. This is in contrast to the typical OLED structure. If the outcoupling layer is place directly on top of the substrate, rather than on top of the OLED, then the outcoupling layer can be fabricated on the substrate prior to OLED deposition. This allows high temperature process for any of the materials in the outcoupling layer. It also allows high resolution patterning of the outcoupling layer using photo, interference, nanoimprint, e-beam, ion beam, focused ion beam, and other lithography techniques that would normally destroy the organic materials contained within the OLED.

According to an embodiment, the outcoupling layer can be comprised of an insulating material, a semiconducting material, a metal, or any combination thereof. The outcoupling layer can consists of two materials of differing refractive index along a plane parallel to the enhancement layer. Preferably, the two materials have different refractive index, wherein the difference in the real part of the refractive index is between 0.1 to 3.0, and more preferably between 0.3 to 3.0.

The outcoupling layer may be patterned to increase the efficiency of scattering light from the non-radiative mode of the enhancement layer. This patterning may be periodic, quasi-periodic, or random. Preferred periodicities are on the order of multiples of the wavelength (m*λ, where m is an integer starting from 1 and λ is the wavelength of light in that material) of the light in the medium of the outcoupling layer. More preferred periodicity is on the order of or smaller than the wavelength of the light in the medium of the outcoupling layer. Scattering of light in the enhancement layer may occur through Bragg or Mie scattering. The outcoupling layer may be composed of insulating, semiconducting, or metallic materials or any combination of these types of materials. The preferred case are two materials which have a refractive index constant contrast. Some examples are high refractive index material that are transparent such as $TiO_2$, $ZrO_2$, diamond, $Si_3N_4$, ZnO, high refractive index glasses (which usually have these materials as components); high refractive index, light absorbing materials: Group 4 and 3-5 semiconductors like Si, Ge, GaAs, GaP; and low refractive index materials: $SiO_2$, most glasses, polymers, organic molecules (~1.6-1.8), $MgF_2$, LiF, air or vacuum.

Preferred examples of highly periodic structures is a linear grating patterned from two materials. Bragg scattering occurs due to the highly periodic interfaces from the two materials of differing dielectric constant in the x-y plane. The linear grating could be periodic in 2D or 3D. The difference in the real part of the refractive index between the two materials should be between 0.1 to 3. More preferably from 0.3 to 3. For 2D patterning, the preferred pitch is 10-6000 nm with a 10-90% duty cycle, more preferably a 20-1000 pitch with a 30-70% duty cycle. For 3D patterning the preferred pattern is a pitch of 10-6000 nm with a 10-90% duty cycle, more preferably a 20-1000 pitch with a 30-70% duty cycle in the x-direction and a 10-6000 nm pitch with a 10-90% duty cycle, more preferably a 20-1000 pitch with a 30-70% duty cycle, in the y-direction. A preferred example of the linear grating is when one of the grating materials is metallic.

The periodicity of the outcoupling layer not only sets the color of light that is scattered out from the enhancement film, it also sets the angle(s) at which that light will be coupled to air. Changing either the refractive index or period of the outcoupling layer will change the 'angular dependence' meaning the intensity of the OLED as a function of angle. Different outcoupling structures may be used depending on the angular dependence of the emission that is desired. Some outcoupling structures that maximize the amount of energy extracted from the enhancement layer might not give the desired angular distribution of light into free space. In this case, the OLED device may have a diffuser placed in front of the pixel to modify the angular dependence of the OLED emission to the desired shape. It is also possible to tuning the outcoupling layer materials and pattering to enhance the amount of light directed into free-space modes.

The polarization of the emission can be tuned using the outcoupling layer. Varying the dimensionality and periodicity of the outcoupling layer can select a type of polarization that is preferentially outcoupled to air.

An embodiment of the outcoupling layer which may be periodic, quasi-periodic, or random is the suspension of micro- or nano-particles within a host matrix. The periodicity of the particles can be randomly throughout the host matrix, however, the size distribution of the particles may be very tight (thus highly periodic). The micro- or nano-particles may be spheres, rods, squares, or other three dimensionally shaped materials having sharp edges and with a refractive index different from the host material. All high refractive index materials disclosed herein can be used for the outcoupling layer including metals. The host for the scattering particles may be a dielectric, metallic, or semiconducting. The loading of the micro- or nano-particle may span from 5 to 95% by weight. The preferred size of the micro- or nano-particle will have at least one dimension on the order of wavelength of visible light in that medium or smaller, typically between 50 nm to 800 nm. The refractive index contrast between the host and the scattering medium is important in tuning the efficiency of scattering. The preferred absolute value of the difference is between 0.1 to 3.0, more preferably from 0.4 to 3.0. Color tuning of the outcoupled light is possible by varying the size and fill fraction of the scattering particles. A preferred embodiment of outcoupling layer is metallic micro- or nano-particles which have sharp edges.

It is expected that the various grating techniques can achieve a color shift of up to 50 nm from the intrinsic peak of the molecule while not sacrificing the amount of light outcoupled to air. The gratings can also achieve narrowing of the intrinsic molecules emission spectrum. When designed to reduce the FWHM the FWHM will be between 10 to 50 nm, with more preferred outcoupling layers achieving a 10 to 30 nm FWHM.

In some embodiments, the outcoupling layer is at least one set of gratings formed of wavelength-sized features that are arranged periodically, quasi-periodically, or randomly, or sub-wavelength-sized features that are arranged periodically, quasi-periodically, or randomly. In one preferred embodiment, the wavelength-sized features and the sub-wavelength-sized features have sharp edges.

In some embodiments, the grating is a linearly patterned grating having a spacing pitch and is formed of two alternating materials. The linear pattern can be in 2D or 3D. In a 2D embodiment, each grating material forms wavelength-sized or sub-wavelength-sized elongated features that are arranged uniformly along one direction with a pitch of 100-2000 nm with a 10-90% duty cycle, and more preferably with a pitch of 20-1000 nm with a duty cycle of 30-70%. Dielectric materials can be used for the two grating materials.

For the 3D linear pattern embodiment, the outcoupling layer is formed of two sets of gratings, each set of gratings formed of two materials, wherein in each set of gratings, each material forms wavelength-sized or sub-wavelength-sized features that are arranged non-uniformly along one direction with a pitch of 100-2000 nm with a 10-90% duty cycle, wherein each set of gratings is oriented in different direction. Each set of gratings can be oriented orthogonal to each other, i.e., in x-direction and y-direction. Dielectric materials can be used for the two grating materials.

In some embodiments, the outcoupling layer is a bullseye grating having a set of concentric rings with well-defined spacing. The preferred pitch or periodicity of the grating is 100-2000 nm and comprises a dielectric material having a refractive index between 1.3 and 4, and wherein space between the grating is filled with any material with a real part of the refractive index between 0.1 to 4.

In some embodiments, a quasi-periodic outcoupling layer is a chirped grating. In a chirped grating, the periodicity varies as a function of distance across one or two dimensions. The preferred structure for the chirped grating outcoupling layer has a fundamental period of between 10 to 2000 nm and increases by 10-60% per period, and wherein the outcoupling layer comprises a dielectric material having a refractive index between 1.3 and 4.

In some embodiments, the outcoupling layer comprises a plurality of particles in a host material, wherein the plurality of particles have a physical dimension smaller than the wavelength of the light being emitted to free space. Preferably, the particles have a physical dimension in the range of 50-800 nm and more preferably 200-800 nm. In some embodiments, the plurality of particles are non-spherical nanoparticles having three dimensional shape such as rods, cubes, and polyhedron. The plurality of particles can be a dielectric material, semiconductor material, or a metal. If the particles are metallic most dielectric or semiconducting material can be used as the host material. If the particles are dielectric or semiconducting, the host material is preferably another dielectric or semiconducting material having a larger refractive index is preferred.

In some embodiments, the outcoupling layer comprises a patterned metallic film.

In some embodiments, the enhancement layer is a second electrode.

In some embodiments, the device further comprises a second electrode disposed between the intervening layer and the outcoupling layer.

The enhancement layer does not require optical interference to maximize the fraction of light outcoupled to free space. Since the enhancement layer's Fermi level can be independent of the contact's Fermi level, the OLED can be inverted without any additional fabrication constraints. This remains true for the preferred enhancement layer of Ge/Ag. If the Ge/Ag enhancement layer were to replace the ITO or IZO anode in a typical OLED device with an Al cathode, then the two contacts are nearly at the same Fermi level. Use of EIL and HIL materials enable efficient charge injection so that the organic layers can be inverted between the enhancement layer and the Al layer.

Typical OLEDs depend on one reflective contact to increase the amount of emission coupled to free space. When the enhancement layer is used with an outcoupling layer all the energy of the dipole could be coupled to the front free space mode without a mirror on the backside of the OLED. This allows the entire OLED to be transparent and for it to be a 1-sided display, not wasting any energy on emission towards the backside of the display.

When the enhancement layer is combined with the outcoupling layer the entire structure may not need a front polarizer to prevent ambient light from being reflected to the user. To achieve this outcome, the outcoupling layer must transmit incident radiation through the OLED to an absorbing medium while still outcoupling the emission that is originating from the enhancement layer.

When the enhancement layer is used with an outcoupling layer all the energy of the excited state could be coupled to the front free space mode. Preventing the reflection of ambient light can occur in two various methods. The first is to build a transparent OLED. Ambient light is transmitted through the OLED and absorbed on the back of the OLED which is coated with an absorbing medium. The second method is to absorb light on a 'dark cathode.' A dark cathode is a conductive material that is highly absorbing. This can be accomplished in a number of ways including texturing of reflective metals or the use of conductive but absorbing materials (highly doped semiconductors).

The enhancement layer either with or without the outcoupling layer can be implemented on flexible substrates. Flexible substrates include: thin glass, polymer sheets, thin silicon, metal sheets, and paper sheets. As the typical enhancement layer will typically have a thickness less than 1 micrometer, and is preferentially thinner than 100 nm, the entire OLED will be flexible while still achieving the benefits to efficiency and lifetime.

Growth of the enhancement or outcoupling layer on any of the flexible substrates may require a planarization layer to smooth the roughness of the substrates before deposition. Alternatively, the outcoupling or enhancement layer could be grown in a conformal processing step using techniques like high pressure sputtering, spray coatings, atomic layer deposition, chemical vapor deposition, or plasma enhanced chemical vapor deposition. Techniques that are typically considered non-conformal, such as vacuum thermal evaporation may be conformal enough if they are used with an off-axis source and off-axis rotation. The rms surface roughness of the planarization layer should be less than 25 nm, preferably less than 10 nm, more preferably less than 5 nm, most preferentially less than <3 nm.

The layered structure of the enhancement layer could also benefit flexible OLEDs by acting as an oxygen and water diffusion barrier.

As the enhancement layer effect is strongly dependent on the distance of the emitter from the enhancement layer, it is possible to use the enhancement layer to increase the performance of a mixed emitter OLED. A preferred embodiment is a white OLED with a blue light emitting material and at least one lower energy light emitting material. In the preferred embodiment the enhancement layer is closest to the blue light emitting material as it is least durable light emitting material. In this embodiment the enhancement layer must be at least semi-transparent to lower energy emission. Additionally, if any outcoupling layer is used, it must also either be transparent to lower energy emission or outcouple lower energy emission as well as the blue emission from the blue light emitting material. When using the enhancement layer with a white OLED, the white OLED can be either a single EML device or a stack structure. The emitter(s) in the EML closest to the enhancement layer will have an increased performance. In the stacked structure, the number and thicknesses of the additional EMLs can be tuned completely independently of the enhancement layer.

In one embodiment of an OLED with an enhancement layer the display is manufactured with no fine metal masking steps. In this embodiment, the color of each sub-pixel is determined by one of two methods. The first is to vary the periodicity and refractive indices of the outcoupling layer under each sub-pixel. Each sub-pixel has a periodicity of the outcoupling layer that is tuned to outcouple light at the desired frequency. The second method is to keep the periodicity and refractive indices of the outcoupling layer identical for each sub-pixel but to vary the refractive index of the intervening layer for each sub-pixel. For bottom emitting enhancement layer OLEDs, the pattering of the outcoupling layer or the intervening is completed on the substrate before OLED deposition. A white OLED with a single EML composed of multiple color light emitting materials is uniformly fabricated over the outcoupling layer achieving a display with no fine metal masks. This manufacturing technique is similar to the white plus color filter bottom emitting OLED display in that it uses a blanket OLED deposition. Each pixel is defined by the combination of an outcoupling layer and the enhancement layer. Since energy is transferred from the light emitting material to the non-radiative modes of the enhancement layer, no light will be emitted unless the outcoupling layer is also present. Thus, the blanket OLED will not illuminate unless an outcoupling layer is present, allowing for fabrication of a display with a high value of pixels per inch with a blanket OLED deposition and no metal masks.

It is also possible to design a display with R,G,B pixels or sub-pixels with very low resolution masking. The advantage of this technology is that the driving voltage of the red and green pixels is not determined by the blue emitter as is the case for the no shadow masking case. In this case, the operating power of the display will be reduced.

The enhancement layer can be designed to emit no radiation unless there is an outcoupling layer built in conjunction with it. Thus, very rough resolution masking of different color OLEDs can be converted into high resolution pixels by patterning the outcoupling layer with high resolution. This high resolution patterning can occur using a number of fabrication techniques and is not limited by temperature or the use of solvent as the substrate may not have organic materials disposed on it when it is patterned.

After fine patterning of the outcoupling layer, low resolution masks for R,G,B pixels can be used to make R, G, and B OLEDs. Regions on which OLED material is deposited but which do not have an outcoupling layer will not emit light meaning the display will have the resolution of the finely patterned outcoupling layer not the lower resolution of the shadow masks.

The emission spectrum from the combination of the enhancement layer and the outcoupling layer can be designed to be directional. In heads up display and displays for virtual reality a display with directionality emission can be beneficial. The increased directionality of emission can be used to only project light on to the eye when the person is looking at one direction relative to the OLED. In one embodiment an OLED device with an enhancement layer and outcoupling layer will be used for a heads up display or in a virtual reality device.

Coupling the enhancement layer with outcoupling layer could result in a very bright, highly directional OLED. Such an OLED is well designed for use as an automotive taillight.

The enhancement layer increases the excited state decay rate constant of the emitter within the OLED. Near infrared phosphors suffer low photoluminescent quantum yields due to the intrinsic non-radiative decay rate constant being much larger than the radiative decay rate constant. If the enhancement layer increases the non-radiative decay constant to a value much larger than the intrinsic non-radiative decay constant it will create an efficient near infrared OLED.

An enhancement layer which features a resonant plasmonic mode may support a quality factor large enough to undergo stimulated emission. If the stimulated emission is pumped by injection of charge from the contacts the end result would be an electrically pumped laser using an organic semiconductor.

In some embodiments, the method of the present disclosure further comprises providing an intervening layer between the enhancement layer and the outcoupling layer, wherein the intervening layer has a thickness less than 50 nm, preferably less than 20 nm thick, and more preferably has a thickness between 1-10 nm. The intervening layer can be a dielectric material or a semiconducting material. The refractive index of the intervening layer is preferably between 0.1 to 4.0. In one preferred embodiment, the refractive index of the intervening layer is between 1.4 to 4.0. The intervening layer has an index of refraction whose real part is 1.1 to 4.0, and more preferably between 1.3 to 2.4.

According to another aspect of the present disclosure, an enhanced OLED device is disclosed. The OLED comprises: a substrate; a first electrode; an organic emissive layer comprising an organic emissive material disposed over the electrode; an enhancement layer, comprising a plasmonic material exhibiting surface plasmon resonance that non-radiatively couples to the organic emissive material and transfer exciton energy from the organic emissive material to non-radiative mode of surface plasmon polaritons, disposed over the organic emissive layer opposite from the first electrode, wherein the enhancement layer is provided no more than a threshold distance away from the organic emissive layer, wherein the organic emissive material has a total non-radiative decay rate constant and a total radiative decay rate constant due to the presence of the enhancement layer and the threshold distance is where the total non-radiative decay rate constant is equal to the total radiative decay rate constant; and an outcoupling layer disposed over the enhancement layer, wherein the outcoupling layer scatters the energy from the surface plasmon polaritons as photons to free space. In some embodiments of this enhanced OLED device, an intervening layer is further disposed between the enhancement layer and the outcoupling layer, wherein the intervening layer has a thickness between 1-10 nm and a refractive index from 0.1 to 4.0. The intervening layer has the characteristics as described above.

In some embodiments, the substrate is transparent and is disposed adjacent to the outcoupling layer opposite from the enhancement layer (i.e. a bottom-emitting device), or the substrate is disposed adjacent to the first electrode opposite from the organic emissive layer (i.e., a top-emitting device).

In some embodiments, an OLED device can have more than one enhancement layer. According to some embodiments, the OLED device comprises a substrate, wherein the substrate can be transparent; a first outcoupling layer disposed over the substrate;
  a first enhancement layer disposed on the first outcoupling layer;
  an organic emissive layer comprising an organic emissive material disposed over the first enhancement layer,
    wherein the first enhancement layer comprising a first plasmonic material exhibiting surface plasmon resonance that non-radiatively couple to the organic emissive material and transfer excited state energy from the organic emissive material to non-radiative mode of surface plasmon polaritons,
    wherein the first enhancement layer is provided no more than a threshold distance away from the organic emissive layer;
  a second enhancement layer disposed over the organic emissive layer, the second enhancement layer comprising a second plasmonic material exhibiting surface plasmon resonance that non-radiatively couple to the organic emissive material and transfer excited state energy from the emissive material to non-radiative mode of surface plasmon polaritons,
    wherein the second enhancement layer is provided no more than the threshold distance away from the organic emissive layer,
    wherein the organic emissive material has a total non-radiative decay rate constant and a total radiative decay rate constant due to the presence of the first and second enhancement layers and the threshold distance is where the total non-radiative decay rate constant is equal to the total radiative decay rate constant; and
  a second outcoupling layer disposed over the second enhancement layer, wherein the first and second outcoupling layers scatter the energy from the surface plasmon polaritons as photons to free space. In other embodiments, this OLED device further comprises a first intervening layer disposed between the first outcoupling layer and the first enhancement layer; and a second intervening layer disposed between the second enhancement layer and the second outcoupling layer.

According to another aspect of the present disclosure, methods for manufacturing plasmon OLED devices are also disclosed. A method for manufacturing a top-emitting organic light emitting device comprises: providing a substrate; depositing a first electrode; depositing an organic emissive layer comprising an organic emissive material over the first electrode; depositing an enhancement layer comprising a plasmonic material disposed over the organic emissive layer no more than a threshold distance away from the organic emissive layer, wherein the organic emissive material has a total non-radiative decay rate constant and a total radiative decay rate constant due to the presence of the enhancement layer and the threshold distance is where the total non-radiative decay rate constant is equal to the total radiative decay rate constant; and depositing an outcoupling layer disposed over the enhancement layer. In some embodiments, the method further includes depositing an intervening dielectric layer disposed over the enhancement layer before depositing the outcoupling layer, wherein the intervening dielectric layer has a thickness between 1-10 nm and a refractive index from 0.1 to 4.0.

In another embodiment, a method for manufacturing a bottom-emitting organic light emitting device comprises: providing a transparent substrate; depositing an outcoupling layer disposed over the transparent substrate; depositing an enhancement layer comprising a plasmonic material disposed over the outcoupling layer; depositing an organic emissive layer comprising an organic emissive material over the enhancement layer no more than a threshold distance away from the enhancement layer, wherein the organic emissive layer and the enhancement layer have a total non-radiative decay rate constant and a total radiative decay rate constant due to the presence of the enhancement layer and the threshold distance is where the total non-radiative decay rate constant is equal to the total radiative decay rate constant; and depositing an electrode over the organic emissive layer. In some embodiments, the method further includes depositing an intervening dielectric layer disposed over the outcoupling layer before depositing the enhancement layer, wherein the intervening dielectric layer has a thickness between 1-10 nm and a refractive index from 0.1 to 4.0.

Outcoupling of light from the enhancement layer is also modulated by the properties of the OLED device. Coupling of the OLED side (the organic emitter layer side) of the enhancement layer to the side of the enhancement layer which points towards free space is dependent on the refractive index at each interface. Since the OLEDs' transport layers can vary in refractive index, choice of transport layer and total thickness may modulate the fraction of light outcoupled from the enhancement layer. Further, in top emitting enhancement layer OLEDs adding an outcoupling layer to the enhancement layer will tune the outcoupling from that layer. The preferred values for the outcoupling layer refractive index is 0.1 to 2.4 with a preferred thicknesses from 5 to 150 nm. More preferred ranges can not be specified without identifying the wavelength of emission of the emitter.

In FIG. 10, a preferred enhancement layer OLED device structure is illustrated. The OLED can be a bottom or top emitting OLED depending on the thickness of the cathode contact. Preferred layer thicknesses are labeled on the figure. Layers with a thickness range that includes 0A are optional layers, not required for the OLED to function properly when using the enhancement layer but featured in typical OLED devices.

Preferred structure of FIG. 6 is a top emitting OLED of FIG. 11 with an enhancement layer composed of 3 repeating of the unit cells 706a, 706b, and 706c. Each of the unit cells is composed of 5-15 nm of Ag as the plasmonic metallic layer 716a and 5-20 nm of host dielectric material layer 716b. The host dielectric material has a real component of the refractive index which spans 1.9 to 1.7 across the visible spectrum. The host dielectric material may have a real component of refractive index from 1.4 to 4.0 without changing the optical properties of the enhancement layer. The imaginary component of the refractive index of the host dielectric should be less than 0.2 across the visible spectrum. Increasing the imaginary component of the refractive index results in a loss of outcoupling of the OLED but maintains improvements in emission rate constant.

In one embodiment for phosphorescent blue light emitting materials the enhancement layer would be used without outcoupling layer. By carefully controlling the distance of the blue emitter from the enhancement layer the number of photons lost to the non-radiative mode of the enhancement layer can be balanced while still observing increases in the durability of the blue light emitting material. This may be achieved without the additional outcoupling layer to extract energy from the enhancement layer. Thus, a blue phosphorescent light emitting material could operate with an EQE between 1 to 3 times the EQE of a fluorescent blue light emitting material while achieving an increase in durability than the blue phosphorescent light emitting material without the enhancement layer.

EXPERIMENTAL

We have performed initial simulations of OLEDs with enhancement layers that demonstrate an increase in the excited state decay rate constant when using an enhancement layer for all light emitting molecules. The simulations were performed on the preferred structure, FIG. 11. The simulated enhancement layer OLED is compared to typical bottom emitting and top emitting devices. The intrinsic emission rate constant for the emitter was set to 1E6 s−1 for all simulations.

Optical modeling on the preferred enhancement layer structure of FIG. 6 using the example enhancement layer of 11 nm Ag\11 nm HOST\11 nm Ag\11 nm HOST\11 nm Ag and an outcoupling layer of 60 nm of HOST we find that the rate of emission of the emitter is increased to 4.7E6 to 3.6E6 s−1 depending on the total OLED thickness. In contrast, the emission rate in a typical top emitting device is 1.37E6 s−1 and 1.53E6 s−1 in a bottom emitting device. The device featuring the enhancement layer represents an approximate 3 fold increase in excited state decay rate constant. We note that the outcoupling of the simulated structures exceeds 20% for the enhancement layer OLEDs as well as the control bottom and top emitting OLEDs. Thus, there is no expected loss of the number of photons that can be extracted from the device when using the enhancement layer. Similar increases in emission rate constant can be observed for enhancement layers composed of typical manufacturing materials and manufacturing thicknesses. For example modeling of the enhancement layer using 15 nm of Mg:Ag 10% instead of Ag produces lifetimes of the same range as that with Ag although the outcoupling is reduced as Mg:Ag is more lossy than Ag.

Figure 15:
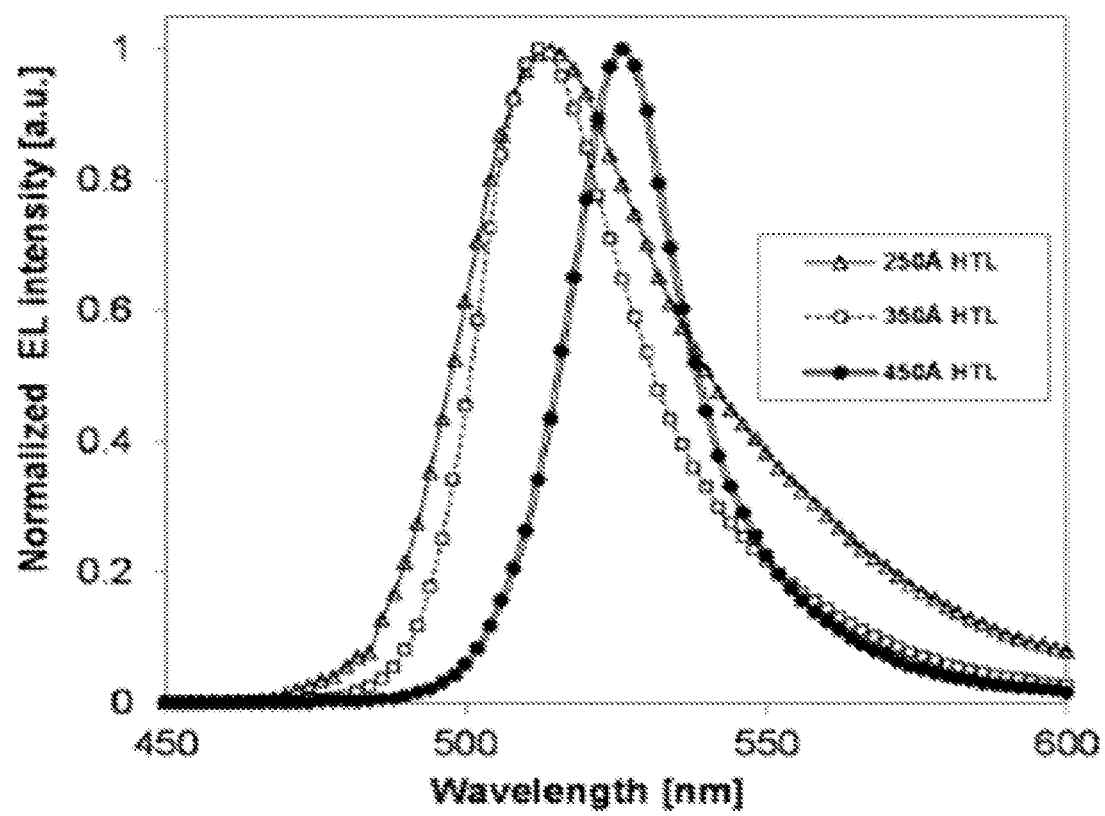
FIG. 15 shows an emission from experimentally realized preferred structure shown in FIG. 7 for various hole transport layer thicknesses.

FIGS. 14A-C demonstrate the optical modeling of the structure in FIG. 11. The increase in emission rate over that of the intrinsic molecule (1E6) is clearly evident for visible emission. The excited state decay rate constant is broadly increased over the entire visible emission range. The enhancement layer OLED also exhibits outcoupling comparable to that of a typical OLED without the enhancement layer, see the plot of FIG. 14B. The structure in FIG. 11 was fabricated and the emission spectrum of the device is shown in FIG. 15. The cavity shows narrowed emission similar to the modeled result with a full-width half maximum of 34-40 nm.

To summarize these observations, the rate constant of emission for an OLED emitter, when an enhancement layer is used, is strongly dependent on the emitter and device architecture. A light emitting material positioned 10 nm from the enhancement layer is expected to have its excited state decay rate constant increase on the order of a factor of 5 and to be closer than either threshold distance. A typical phosphorescent emitter has an emission rate constant between 1.25E7 to 2E5 1/s, the expected emission rate in the presence of the enhancement layer is 6.25E7 to 1E6 1/s. For emitters 5 nm from the enhancement layer, the expected excited state decay rate constant increase is on the order of a factor of 20. These rate constant enhancements are significantly greater than those possible with a microcavity or other typically used methods of changing the photon density of states in an OLED where the rate enhancement is on the order of a factor of 1.5 to 2.

Optical modeling predicts that using an enhancement layer will increase the average excited state decay rate constant by a factor of 1.5 to 400 for the preferred embodiment. Theoretical estimates for more complex enhancement layers involving stacks of Ag and $Al_2O_3$ thin films place the increase in the excited state decay rate constant as large as a factor of 1000. The exact relationship between improved emission rate constant and OLED durability is unknown. An increase in the excited state decay rate constant of the light emitter means that the emitter spends less time in the excited state and has less time to undergo an event which degrades the performance of the emitter. Without being constrained, the expected increase in OLED durability using an enhancement layer is 1.5 to 10000 times. Due to the potential for changes in emission lineshape of the emitter when using the enhancement layer improvements to durability of the OLED may occur under either 1) constant current aging or 2) constant luminous efficacy aging. To be explicit, narrowing of the emission lineshape or enhancement of off-peak emission by the enhancement layer may change the initial luminous efficacy (due to the sensitivity of the human eye) of the OLED. Thus, direct comparison of the aging rate under constant luminous efficiency may show a different level of improvement than aging the OLED under constant current.

It is understood that the various embodiments described herein are by way of example only, and are not intended to limit the scope of the invention. The present invention as claimed may therefore include variations from the particular examples and preferred embodiments described herein, as will be apparent to one of skill in the art. It is understood that various theories as to why the invention works are not intended to be limiting.

We claim:

1. A device comprising:
    a substrate; a first electrode; an organic emissive layer comprising an organic emissive material disposed over the electrode;
    an enhancement layer comprising optically active metamaterials, or hyperbolic metamaterials, which transfer radiative energy from the organic emissive material to a non-radiative mode, wherein the enhancement layer is disposed over the organic emissive layer opposite from the first electrode, and is positioned no more than a threshold distance away from the organic emissive layer,
    wherein the organic emissive material has a total non-radiative decay rate constant and a total radiative decay rate constant due to the presence of the enhancement layer, and the threshold distance is where the total non-radiative decay rate constant is equal to the total radiative decay rate constant; and
    an outcoupling layer disposed over the enhancement layer, wherein the outcoupling layer scatters radiative energy from the enhancement layer to free space.

2. The device of claim 1, further comprising an intervening layer disposed between the enhancement layer and the outcoupling layer, wherein the intervening layer has a refractive index from 1.1 to 4.0.

3. The device of claim 1, wherein the substrate is transparent and is disposed adjacent to the outcoupling layer opposite from the enhancement layer, or the substrate is disposed adjacent to the first electrode opposite from the organic emissive layer.

4. The device of claim 1, further comprising one or more functional layers positioned between the enhancement layer and the organic emissive layer to set the threshold distance.

5. The device of claim 4, wherein the organic emissive material is a phosphorescent emissive material, and the threshold distance is less than 100 nm.

6. The device of claim 4, wherein the organic emissive material is a phosphorescent emissive material, and the threshold distance is less than 60 nm.

7. The device of claim 1, wherein the enhancement layer includes a contact layer, and therefore, can function as a second electrode.

8. The device of claim 4, wherein the one or more functional layers is selected from a hole blocking layer, an electron transport layer, or an electron injection layer.

9. The device of claim 4, wherein the one or more functional layers is selected from an electron blocking layer, a hole transport layer, or a hole injection layer.

10. The device of claim 1, wherein the enhancement layer is disposed on a flexible substrate selected from the group consisting of thin glass, polymer sheets, thin silicon, metal sheets, and paper sheets, wherein the enhancement layer has a thickness of less than 100 nm.

11. The device of claim 1 being a stacked white OLED with at least two emitting layers, one of which is a blue emitting layer that is within the threshold distance.

12. A two-way emitting OLED comprising:
an organic emissive layer including a first surface and an opposite second surface, the organic emissive layer comprising an organic emissive material, and disposed between a first enhancement layer and a second enhancement layer;
wherein the organic emissive material has a total non-radiative decay rate constant and a total radiative decay rate constant due to the presence of the enhancement layer, and the threshold distance is where the total non-radiative decay rate constant is equal to the total radiative decay rate constant;
wherein the first enhancement layer comprises a first plasmonic material, a first optically active metamaterial, or a first hyperbolic metamaterial, which transfers radiative energy from an organic emissive layer, the first enhancement layer having a surface positioned no more than a threshold distance away from the first surface of the organic emissive layer,
wherein the second enhancement layer comprises a second plasmonic material, a second optically active metamaterial, or a second hyperbolic metamaterial, which transfers radiative energy from the organic emissive layer, the second enhancement layer having a surface positioned no more than the threshold distance away from second surface of the organic emissive layer; and
a first outcoupling layer disposed on a surface of the first enhancement layer opposite the threshold surface of the first enhancement layer, and a second outcoupling layer disposed on a surface of the second enhancement layer opposite the threshold surface of the second enhancement layer.

13. The device of claim 12, further comprising one or more first functional layers positioned between the first enhancement layer and the organic emissive layer to set a first distance, which is less than the threshold distance, and one or more second functional layers positioned between the second enhancement layer and the organic emissive layer to set a second distance, which is less than the threshold distance.

14. The device of claim 12, wherein the first and/or second enhancement layers can function as electrodes.

15. The device of claim 13, wherein the organic emissive material is a phosphorescent emissive material, and the first distance, and the second distance, is less than 60 nm.

16. The device of claim 12, wherein the first enhancement layer and the second enhancement layer are the same or different.

17. A method for improving the operation of an OLED, the method comprising:
providing a substrate, a first electrode; and an organic emissive layer that includes an organic emissive material disposed over the electrode;
providing an enhancement layer comprising a plasmonic material, an optically active metamaterial, or a hyperbolic metamaterial, which non-radiatively couple to the organic emissive material to transfer excited state energy from the emissive material to non-radiative modes;
wherein the enhancement layer is disposed over the organic emissive layer opposite from the first electrode, and is no more than a threshold distance away from the organic emissive layer;
wherein the organic emissive material has a total non-radiative decay rate constant and a total radiative decay rate constant due to the presence of the enhancement layer, and the threshold distance is where the total non-radiative decay rate constant is equal to the total radiative decay rate constant; whereby the device emits light into free space from the enhancement layer by scattering the energy from the non-radiative modes through an outcoupling layer that is provided proximate to the enhancement layer but opposite from the organic emissive layer.

18. The method of claim 17, further comprising providing one or more functional layers positioned between the enhancement layer and the organic emissive layer to set the threshold distance of less than 100 nm.

19. The method of claim 17, wherein the enhancement layer is at least one set of gratings formed of wavelength-sized or sub-wavelength-sized features that are arranged periodically, quasi-periodically, or randomly.

20. The method of claim 19, wherein the enhancement layer is at least one set of gratings formed of wavelength-sized or sub-wavelength-sized features having sharp edges that are arranged periodically, quasi-periodically, or randomly, wherein the grating has a periodic pattern, wherein the wavelength-sized or sub-wavelength-sized features are arranged uniformly along one direction.

* * * * *